United States Patent
Teetzel

(10) Patent No.: US 8,848,824 B2
(45) Date of Patent: Sep. 30, 2014

(54) HIGH EFFICIENCY RF SYSTEM LINEARIZER USING CONTROLLED COMPLEX NONLINEAR DISTORTION GENERATORS

(76) Inventor: Andrew M. Teetzel, Wilson, WY (US)

( * ) Notice: Subject to any disclaimer, the term of this patent is extended or adjusted under 35 U.S.C. 154(b) by 710 days.

(21) Appl. No.: 12/400,764

(22) Filed: Mar. 9, 2009

(65) Prior Publication Data

US 2010/0225389 A1   Sep. 9, 2010

Related U.S. Application Data

(60) Provisional application No. 61/034,925, filed on Mar. 7, 2008.

(51) Int. Cl.
| H04K 1/02 | (2006.01) |
| H03F 1/32 | (2006.01) |
| H03F 3/21 | (2006.01) |
| H03F 3/45 | (2006.01) |
| H03F 1/56 | (2006.01) |

(52) U.S. Cl.
CPC .......... *H03F 3/45098* (2013.01); *H03F 1/3276* (2013.01); *H03F 3/211* (2013.01); *H03F 1/3211* (2013.01); *H03F 1/56* (2013.01)
USPC ........................................ 375/296

(58) Field of Classification Search
USPC ........ 375/295, 296, 297; 330/10, 136, 124 R, 330/149; 332/160; 327/317
See application file for complete search history.

(56) References Cited

U.S. PATENT DOCUMENTS

| 4,835,488 A | 5/1989 | Garuts |
| 5,481,389 A * | 1/1996 | Pidgeon et al. ............... 398/208 |
| 5,715,532 A | 2/1998 | Sagawa et al. |
| 6,075,411 A | 6/2000 | Briffa et al. |
| 6,208,207 B1 | 3/2001 | Cavers |
| 6,449,465 B1 * | 9/2002 | Gailus et al. .................. 455/126 |
| 6,573,793 B1 | 6/2003 | Gutierrez |
| 6,614,854 B1 * | 9/2003 | Chow et al. .................... 375/297 |

(Continued)

FOREIGN PATENT DOCUMENTS

GB    2356093    5/2001

OTHER PUBLICATIONS

Vuolevi, J., Distortion in RF Power Amplifiers, Norwood, MA, Artech House, 2003.

(Continued)

*Primary Examiner* — Daniel Washburn
*Assistant Examiner* — Fitwi Hailegiorgis
(74) *Attorney, Agent, or Firm* — Craig M. Stainbrook; Stainbrook & Stainbrook, LLP

(57) ABSTRACT

A linearizer reduces nonlinear intermodulation distortion in radio frequency and microwave systems by first directly generating in-phase and quadrature nonlinear intermodulation products of the system input. Controllable amounts of each phase are then added back into the system such that the vector sum of nonlinear intermodulation products at the output is reduced or eliminated by destructive interference, while the fundamentals are substantially unaffected. The quadrature distorted signals are generated with two lightly-biased and thus overdriven differential pairs having gain-determining degeneration impedances that are in quadrature with each other. The amount of each quadrature phase summed to the output is controlled with electronically tunable four-quadrant variable attenuators. The quadrature phasing enables rapidly convergent tuning to minimize distortion using conventional scalar spectral analysis. The advantages of a linearizer using rectangular vector coordinate system are significant.

9 Claims, 18 Drawing Sheets

(56) References Cited

U.S. PATENT DOCUMENTS

| | | |
|---|---|---|
| 6,750,709 B2 * | 6/2004 | Raghavan et al. ............ 330/149 |
| 6,757,338 B1 | 6/2004 | Kim |
| 6,788,139 B2 | 9/2004 | Villemazet |
| 6,798,294 B2 | 9/2004 | Kuiri |
| 6,956,433 B2 * | 10/2005 | Kim et al. ..................... 330/149 |
| 6,993,301 B1 * | 1/2006 | Kenington et al. ........ 455/114.3 |
| 7,088,980 B2 | 8/2006 | Otaka |
| 7,102,435 B2 | 9/2006 | Bosch |
| 7,289,575 B1 * | 10/2007 | Kenington ................... 375/296 |
| 2005/0047521 A1 * | 3/2005 | Ishikawa et al. ............. 375/296 |
| 2005/0116776 A1 | 6/2005 | Cavers et al. |
| 2005/0127995 A1 | 6/2005 | Domokos |
| 2006/0197577 A1 * | 9/2006 | Mukherjee et al. ........... 327/317 |

OTHER PUBLICATIONS

Cripps, Steven, Advanced Techniques in RF Power Amplifier Design, Artcher House, 2002, p. 79.

Sansen, W., Distortion in Elementary Transistor Circuits, IEEE Trans. Circuits and Systems-II, Analog and Digital Signal Processing, Mar. 1999, vol. 46, No. 3.

Leung, Vincent W. and Larson, Larry; Analysis of Envelope Signal Injection for Improvement of RF Amplifier Intermodulation Distortion, IEEE J. Solid-State Circuits, Sep. 2005, vol. 40, No. 9.

Webster, et al., Control of Circuit Distortion by the Derivative Superposition Method, IEEE Microwave and Guided Wave Letters, Mar. 1996, vol. 6, No. 3.

Aparin, V. and Larson, L.E.; Modified Derivative Superposition Method for Linearizing FET Low Noise Amplifiers, IEEE Trans. Microwave Theory and Techniques, Feb. 2005, vol. 53, No. 2, pp. 571-581.

Ganesan, et al., A Highly Linear Low-Noise Amplifier, IEEE Trans. Microwave Theory and Technique, Dec. 2006, pp. 4079-4085, vol. 54, No. 12.

Kim, W., et al., A Mixer with Third-Order Nonlinearity Cancellation Technique for CDMA Applications, IEEE Microwave and Wireless Components Letters, Jan. 2017, pp. 76-78, vol. 17, No. 1.

Cripps, Steven, Advanced Techniques in RF Power Amplifier, Artech House, 2002, p. 156.

Raab, F.H., et al., Power Amplifiers and Transmitters for RF and Microwave, IEEE Trans. Microwave Theory and Techniques, vol. 50, No. 3, Mar. 2002, pp. 814-826.

Otaka, S., et al., A +10 dBm IIP3 SiGe mixer with IMD3 cancellation technique, IEEE ISSC Tech. Dig., Feb. 2004, pp. 398-399.

Cho, et al., Linearity Optimization of a High Power Doherty Amplifier Based on Post-Distortion Compensation, IEEE Microwave and Wireless Components Letters, vol. 15, No. 11, Nov. 2005.

Wyszynski, et al., Design of a 2.7-GHz Linear OTA and a 250-MHz Elliptic Filter in Bipolar Transistor-Array Technology, IEEE Transactions on Circuits and Systems-II; Analog and Digital Signal Processing, vol. 40, No. 1, Jan. 1993.

* cited by examiner 0 dB of Isolation 6 dB of Isolation

Infinite Isolation

HIGH EFFICIENCY RF SYSTEM LINEARIZER USING CONTROLLED COMPLEX NONLINEAR DISTORTION GENERATORS

CROSS REFERENCES TO RELATED APPLICATIONS

The present application claims the benefit of U.S. Provisional Patent Application Ser. No. 61/034,925, filed Mar. 7, 2008 (Mar. 7, 2008).

STATEMENT REGARDING FEDERALLY SPONSORED RESEARCH OR DEVELOPMENT

Not applicable.

THE NAMES OR PARTIES TO A JOINT RESEARCH AGREEMENT

Not applicable.

INCORPORATION-BY-REFERENCE OF MATERIAL SUBMITTED ON A COMPACT DISC

Not applicable.

BACKGROUND OF THE INVENTION

1. Field of the Invention

The present invention relates generally to circuits for reducing and/or eliminating distortion in RF and microwave systems, and more particularly to a RF and microwave system linearizer using quadrature nonlinear distortion generators.

2. Discussion of Related Art Including Information Disclosed Under 37 CFR §§1.97, 1.98

The demand for higher information throughput in radio frequency (RF) and microwave communications systems such as advanced digital cellular phone systems has led to the use of modern, spectrally efficient modulation techniques such as WCDMA and FDM. Such spectrally efficient techniques however come with high waveform peak-to-average ratios (PAR). Circuits processing these signals must remain linear over this high instantaneous dynamic range to avoid generating nonlinear distortion that causes interference to other users. Maintaining linearity is especially a problem for the power amplifier (PA)—usually the most power-consumptive part of the system. Lowering PA average power ("power backoff") to accommodate the peak powers and avoid nonlinear distortion also unacceptably diminishes its power efficiency. Efficiency and linearity are mutually exclusive in traditional PAs, and for good linearity with reasonable efficiency some form of linearization is needed [Vuolevi, J., *Distortion in RF Power Amplifiers*, Norwood, Mass.: Artech House, 2003]. Diminished efficiency worsens battery life in handhelds and worsens energy costs and thermal management issues in base stations. The common design paradigm has become to first design an efficient PA using one of the numerous available techniques [Raab, F. H, et. al., "Power Amplifiers and Transmitters for RF and Microwave," IEEE Trans. Microwave Theory and Techniques, Vol. 50, No. 3, March 2002, pp. 814-826] and then invoke linearization to fix its linearity.

It needs to be noted that simply filtering out undesired nonlinear distortion products is ineffective as distortion products due to odd-degree nonlinearities manifest both within and very close to the fundamental frequencies. The nonlinearities within the fundamental frequency interfere with the in-band signals and worsens error vector magnitude (EVM), while nonlinearities close to the fundamental frequency cause adjacent channel power (ACP) that interferes with other users. Overall system capacity is diminished.

An important and difficult aspect of RF and microwave power amplifier linearization is the vector nature of the signals. At low frequencies distortion products are collinear with the fundamental signal, that is, they have a simple plus-or-minus sign relationship to the fundamental signal, either in-phase or antiphase. At RF and microwave frequencies, however, distortion phase can deviate from fundamental signal phase by arbitrary angles for many reasons, including reactive and physically remote nonlinearities. Designing for, and maintaining, the proper magnitude and phase relationships (that is, vector relationships) between distortion products and the ameliorative solution is a difficult aspect of linearization. Vector tuning of a signal typically comes in either polar format (magnitude and phase) or rectangular format ("In-phase" and "Quadrature", or "IQ"). The polar format independently tunes magnitude and phase, but the phase modulation aspect is in general difficult to implement, especially if delay lines are used. The dynamical coordination of the magnitude and phase modulators is also very difficult, especially at the high modulation rates of modern systems. Further, inexpensive scalar spectrum analysis provides no indication as to whether magnitude or phase is preferably adjusted while tuning for lowered distortion, and so convergence can be very poor unless expensive vector spectrum analysis is invoked.

The physically large and mixed-technology aspects of many linearizer implementations preclude integration, thus increasing cost and environmental sensitivities. Physically large distributed elements such as delay lines are not uncommon [see, for example, U.S. Pat. No. 6,788,139, to Villemazet], but are limited to microwave frequencies, and their lengths are very difficult to adjust. Phase shifters are easier to tune but have the desired delay only at a single frequency, limiting instantaneous linearization bandwidth. Many linearization implementations also consume high DC power, in direct opposition to the primary engendering motivation. In broad terms, linearization techniques include careful circuit design, power backoff, feedback, feedforward, predistortion (both analog and digital), and derivative superposition.

Careful circuit design includes using quality components (particularly high linearity active devices), carefully chosen bias points and component values, and sound implementation. But this comes at the expense of design time, cost, and high DC power consumption. These procedures are well known and widely applied, so the drive for yet further linearity improvement requires the development of improved linearization techniques, an end to which the present invention is directed.

The power backoff approach reduces fundamental power levels to a small fraction of the standing voltage and current bias points, taking advantage of the even faster (relative to the fundamental) reduction rate of the distortion products. The diminished power efficiency quickly becomes unacceptable, however. Further, some forms of distortion found in Class B and deep Class AB amplifiers remain even at lower power levels [see, Steven Cripps, *Advanced Techniques in RF Power Amplifier Design*, Artech House, 2002, p. 79].

Systems using negative feedback at RF and microwave frequencies reduce fractional distortion by a factor of the loop gain [Sansen, W., "Distortion in Elementary Transistor Circuits," IEEE Trans. Circuits and Systems—II, Analog and Digital Signal Processing, Vol. 46, No. 3, March 1999] and provide desensitivity to variations in forward path component values. But limited loop gains and excess phase shifts at such high frequencies forces severe and unacceptable tradeoffs amongst distortion suppression, bandwidth, and stability.

Envelope-rate negative feedback systems, such as Cartesian feedback, downconvert to baseband the modulated output signal for comparison to the baseband modulation inputs, taking advantage of the high loop gains available at the baseband frequencies. But errors in the feedback path, and in particular the added noise, delay, and nonlinearities of the downconverter, are not corrected by the loop and add directly to the signal. Additionally, sensitivity loop delays remains high on the scale of an RF period so as to make drift and instability a problem. The downconverter also adds appreciable cost and complexity to the system.

Feedforward systems generate an error signal (a scaled version of the added distortion of the PA) by subtracting the PA input and an appropriately scaled version of its output. The error signal is then appropriately amplified by an "error amplifier" and subtracted from the original amplifier output to cancel distortion. Feedforward systems have good linearity and very wide bandwidths. They are popular, despite their numerous disadvantages. They have an undesirable reliance on accurate tuning of amplitude scaling and time delays and, lacking negative feedback, they are sensitive to drifts in the forward-path component values. Adaptive systems are commonly needed to compensate for drift, adding further complexity and expense. Further, the power drawn by the error amplifier and the inefficiencies of the RF/microwave power combiner at the output serve to limit overall available efficiency.

Predistortion systems place a compensating nonlinearity in series with a distorting amplifier input. Postdistorters (in series with the output) are also possible, but predistorters are far more common as they operate at the lower power levels at an amplifier input and thus consume little DC power for better overall efficiency. Both analog and digital predistorters are common.

As with feedforward, predistorters are open loop and thus susceptible to drift, either in the amplifier being linearized (the "distorting main amplifier", or DMA) or the linearizer itself. They are therefore commonly implemented within an adaptive system, so easy tunability is a desired feature. Predistorters are generally of different physical construction and in less-than-intimate contact with the DMA, exacerbating drift problems. Another issue with predistorters is that when canceling lower order distortion products, the cascade of predistorter plus distorting main amplifier generates new undesired distortion products of orders higher than those of the nonlinearities of either individual block [Steven Cripps, *Advanced Techniques in RF Power Amplifier Design*, Artech House, 2002, pg. 156].

Analog RF predistorters have the advantage of being inherently broadband because even very wide instantaneous modulation bandwidths constitute a small fraction of the RF center frequency. Their DC power consumption is therefore effectively independent of modulation bandwidth and they can even be entirely passive [Ibid., Ch. 5]. Digital predistorters (DPD), on the other hand, operate at baseband frequencies and must provide processing power (and thus consume DC power) directly proportional to the modulation bandwidth—a disadvantage given the modern trend towards expanding modulation bandwidths. Further, as systems are driven harder for better power efficiency, they also increase the order of significant distortion products. Linearizing higher degrees of nonlinearity (5ths and 7ths), rapidly expands the bandwidth the DPD must address to several multiples of the fundamentals. Note that these bandwidth and power issues involve not only the DPD but also the digital-to-analog converter (DAC) and the input stages of the upconverter. The power consumed by the digital signal processing subsystem in this situation rapidly diminishes overall system power efficiency to a point of diminishing returns.

Another approach to linearization is "out-of-band" (OOB) linearization. OOB linearization takes advantage of the fact that when an original RF fundamental signal is first multiplied by itself (constituting a second-order operation) as an intermediate step, and that result is again multiplied by the original RF fundamental signal (another second-order operation), then the final result includes third-order products and, importantly, the intermediate step of this cascade-of-multiplications (COM) process constitutes an opportunity to manipulate the vector attributes of the signal at frequencies (either baseband or second harmonic) far removed from, and thus not interfering with, the fundamental RF frequencies. The latter step of the COM process frequency-translates the vector-manipulated signal back to and near the fundamental RF frequencies for desirably destructive interference with the DMA's direct third-order distortion products.

Linearizers based on OOB COM can be based on either a down-then-up (DTU) sequence or up-then-down (UTD) sequence. The UTD sequence is relatively rare because of difficulties of signal processing at the very high second harmonic frequencies and because the load second harmonic impedance is often engineered to be short for efficiency reasons [Cripps]. The more common DTU sequence offers the relative ease of signal processing at the low baseband frequencies and provides an opportunity to address long-term memory effects [Vuolevi].

An example of a DTU COM OOB predistorter is found in U.S. Pat. No. 6,750,709, to Raghavan. The second-degree nonlinearity of a RF input diode power detector generates a downconverted envelope signal at baseband frequencies (the first COM step). Two independently scaled versions of this envelope signal then amplitude modulate the I and Q phases of the original RF signal (the second COM step). This basic concept is extended in U.S. Pat. Appl. Pub. No. 20150127995, by Domokos, and U.S. Pat. No. 6,757,338, to Kim, which teach higher even orders of baseband nonlinear processing to address (after upconversion) fifth and higher degrees of RF nonlinearity.

Another OOB linearization example is the integrated DTU system of Leung and Larson [Leung, Vincent. W; and Larson, Larry, "*Analysis of Envelope Signal Injection for Improvement of RF Amplifier Intermodulation Distortion,*" IEEE J. Solid-State Circuits, Vol. 40, No. 9, September 2005]. This article teaches an on-chip detector which creates the baseband-frequency envelope of the RF input signal (the first COM step), a scaled version of which dynamically adjusts the bias point of the nearby power amplifier transistor (the second COM step). Lacking vector tunability however, this scalar approach provides only partial linearization and relies on the short time delays relative to a RF period achieved with tight on-chip integration. Disadvantages of DTU OOB COM systems are susceptibility to noise in the RF input envelope detection process and the vagaries of low frequency circuits such as bandwidth limitations and 1/f noise. An RF quadrature phase shifter is also required in the approaches that include vector tuning.

The derivative superposition approach linearizes a FET-based DMA with an added auxiliary parallel FET, sized and biased to embody a compensating transfer function nonlinearity. In an exemplary circuit, the auxiliary FET's gate voltage is biased towards pinchoff, creating relatively little fundamental output but an expansive transfer function characteristic that compensates the compressive transfer function characteristic of the MDA FET. IMD3 products are thereby cancelled. [See, Webster et. al., "Control of Circuit Distortion by the Derivative Superposition Method", IEEE Microwave and Guided Wave Letters, Vol. 6, No. 3, March 1996.]

Derivative superposition minimizes distortion at the circuit level and so is nicely amenable to IC technology, taking advantage of the tight matching, precise scaling, close physical proximity, and thus good tracking of the main and auxiliary devices. The option also exists to add additional parallel FETs to address yet higher degrees of nonlinearity. Derivative superposition addresses transfer function nonlinearities but does not address the products of the nonlinear output current divide ratio between the nonlinear part of the FET's output admittance and the load. Worse, the nonlinear part of the FET's output admittance contains both real and imaginary parts at RF such that the output distortion product vectors are not necessarily aligned in phase with those from the transfer function nonlinearities. An auxiliary FET bias adjustment, in essence a scalar tuning control, cannot provide compensation.

The vector nature of the distortion signals is addressed in the modified derivative superposition (MDS) approach of Aparin and Larson, wherein a tapped inductor in the FETs' source connections aligns the nonlinear distortion product vectors for proper cancellation. [Aparin, V. and Larson, L. E., "Modified Derivative Superposition Method for Linearizing FET Low Noise Amplifiers", IEEE Trans. Microwave Theory and Techniques, Vol. 53, No. 2, February 2015, pp 571-581]. Unfortunately the design analysis equations are very complicated, even when considering only a subset of FET and circuit properties. The tapped inductor is also a difficult and physically large design. Further, the design works at only one center frequency and is thus not amenable to multi-band radios. The lack of vector tenability, the intractably difficult analysis, and the insufficiently accurate simulation models for very high levels of distortion suppression mean the design is substantially empirical, requiring several iterations. Even then, process variations limit the statistically available linearity [Ganesan, et. al., "A Highly Linear Low-Noise Amplifier", IEEE Trans. Microwave Theory and Technique, Vol. 54, No 12, December 2016, pp. 4079-4085].

Another disadvantage of the derivative superposition approach is that it cannot accommodate bipolar junction transistor (BJT) single-ended structures. While the sign of a FET's third-order power series coefficient can be altered with a bias change, a BJT's transfer function derivatives all have the same sign, independent of bias.

The approaches of Garuts and of Kim et al each linearize a BJT main differential transconductance stage with a parallel, lightly biased (and thus overdriven) auxiliary differential transconductance stage and subtractive output summations. The auxiliary stage operates at a very high fractional state of nonlinearity relative to the main transconductance stage such that its distortion product magnitudes equal those of the main stage, but with relatively little (and thus substantially noninterfering) fundamental output content. Both incorporate judicious placement of additional passive elements to fine-tune the high frequency distortion vectors for enhanced cancellation. [Garuts, U.S. Pat. No. 4,835,488] and [Kim, W., et. Al, "A Mixer With Third-Order Nonlinearity Cancellation Technique for CDMA Applications", IEEE Microwave and Wireless Components Letters, Vol. 17, No. 1, January 2017, pp 76-78] Garuts's low pass design adds resistors to the auxiliary stage bases that effectively gyrate to an equivalent emitter inductance at frequencies above the device $f_b$, maneuvering the auxiliary stage's distortion vectors in the desired manner. Kim et al use degeneration resistors and collector RC phase-shift networks in the auxiliary stage.

U.S. Pat. No. 7,088,980 teaches use of a mixer ("frequency converter") within a structure similar to Kim et al, and adds a phase-shifter in the auxiliary mixer's local oscillator input instead of the collector RC phase-shift network. [See also, S. Otaka, M. Ashida, M. Ishii, and T. Itakura, "A +10 dBm IIP3 SiGe mixer with IMD3 cancellation technique," in *IEEE ISSC Tech. Dig.*, February 2004, pp. 398-399.] Otaka also teaches both single-ended and FET-based variants of the transconductance stages. Like derivative superposition, the integrated linearizers of Garuts, Kim et al, and Otaka suffer a difficult design process and high sensitivity to process variations.

In general, maintaining aggressive linearization goals requires compensation for drift over time, voltage, and temperature. Negative feedback reduces drift. Linearizers with local RF negative feedback suffer other problems mentioned previously. Open loop systems such as feedforward and predistortion require adaptivity as a defense against drift. Adaptivity is in essence a larger negative feedback loop around the linearizer/DMA combination. Adaptive systems require a tunable linearizer, and adaptive systems at RF and microwave frequencies require a vector-tunable linearizer. The complexity of an adaptive system is eased considerably with a linearizer embodying orthogonality in its vector tuning controls (meaning controls that do not interact with each other), that is, orthogonal magnitude and phase controls, or orthogonal real part and imaginary part controls.

The foregoing patents reflect the current state of the art of which the present inventor is aware. Reference to, and discussion of, these patents is intended to aid in discharging Applicant's acknowledged duty of candor in disclosing information that may be relevant to the examination of claims to the present invention. However, it is respectfully submitted that none of the above-indicated patents disclose, teach, suggest, show, or otherwise render obvious, either singly or when considered in combination, the invention described and claimed herein.

BRIEF SUMMARY OF THE INVENTION

The present invention is a linearizer that reduces nonlinear intermodulation distortion in radio frequency and microwave systems by first generating quadrature phases of nonlinear intermodulation products of the system input. Selected amounts of each phase are then added back into the system such that the vector sum of nonlinear intermodulation distortion products at the output is reduced or eliminated by destructive interference.

Accordingly, it is a principal object of the present invention to provide a linearizer that addresses the vector nature of signal distortion at RF and microwave frequencies.

Another object of the present invention is to provide a linearizer of low cost and small size by virtue of simple construction and easy integrability.

Yet another object of the present invention is to provide a linearizer of easy controllability by virtue of electronically adjustable bias current sources and variable gain attenuators.

Still another object is to provide a linearizer that it is tunable and thus of easy design, not requiring accurate modeling or analysis of nonlinear elements, embedding impedances, or magnetic structures such as inductors or transformers.

A further objection is to provide a linearizer with rectangular (I and Q) tuning for rapidly convergent tuning of distortion cancellation with inexpensive scalar instrumentation; (f) to provide a linearizer with orthogonal tuning for easy inclusion in adaptive systems; (g) to provide a linearizer easily extendable for the independent linearization of different orders of distortion products.

A still further object is to provide a linearizer with reduced environmental sensitivities by virtue of matched technology, shared substrate, and close physical proximity to the main amplifier.

Yet another object is to provide a linearizer with low DC power consumption.

A still further object is to provide a linearizer that (in contrast to a predistortion) does not generate additional undesired high-order distortion products while eliminating lower-order distortion products.

Another object is to provide a linearizer operating in a high impedance circuit environment wherein signal summations are accomplished with simple hardwired current summations instead of the lossy power combiners required in non-integrated approaches.

Yet another object is to provide a linearizer that also provides predistortion functionality and thus addresses distortion from both local and remote sources.

A still further object is to provide a linearizer sharing the same technology and physical and electrical environment as the distorting main amplifier and its low-frequency thermal, electrical impedance, and charge-trapping phenomenon.

Another object is to provide a linearizer easily amenable to both field-effect and bipolar transistors.

Another object is to provide a linearizer of re-tunable center frequency to accommodate multi-band radio systems.

Another object is to provide a linearizer with a single large global tuning minimum and no local tuning minima.

Yet another object is to provide a linearizer including baseband processing to addressing long-term memory effects.

And yet another object is to provide a high efficiency complex auxiliary peaking amplifier that improves the power, efficiency, and linearity of a main amplifier operating in a high-efficiency mode.

Still further objects and advantages will become apparent from a consideration of the ensuing description and drawings.

Other novel features which are characteristic of the invention, as to organization and method of operation, together with further objects and advantages thereof will be better understood from the following description considered in connection with the accompanying drawing, in which preferred embodiments of the invention are illustrated by way of example. It is to be expressly understood, however, that the drawing is for illustration and description only and is not intended as a definition of the limits of the invention. The various features of novelty which characterize the invention are pointed out with particularity in the claims annexed to and forming part of this disclosure. The invention resides not in any one of these features taken alone, but rather in the particular combination of all of its structures for the functions specified.

BRIEF DESCRIPTION OF THE SEVERAL VIEWS OF THE DRAWINGS

The invention will be better understood and objects other than those set forth above will become apparent when consideration is given to the following detailed description thereof. Such description makes reference to the annexed drawings wherein.

DETAILED DESCRIPTION OF THE INVENTION

Preferred embodiments of the present invention will now be described with reference to linearizing (i.e., suppressing) the third order intermodulation (IM3) distortion of a "Distorting Main Amplifier" (DMA) in response to a two-tone RF or microwave signal input. It is to be understood, however, that the invention is equally applicable to linearizing higher orders of intermodulation distortion, to signals of any arbitrary modulation, and to arbitrary distorting functional blocks, i.e. not necessarily an amplifier. It is also to be understood that the term "quadrature" refers to a ninety-degree phase relationship between an "in-phase" signal and a "quadrature" signal, and generally to the phase relationships of output currents from an "In-phase Nonlinear Distortion Generator" (INDG) and a "Quadrature Nonlinear Distortion Generator" (QNDG). It is also to be understood that both single-ended and differential embodiments are both feasible, and that sometimes system-level schematics are drawn with single-ended connections solely for simplicity rather than inferring a preferred embodiment. Finally, it is to be understood that vectors drawn in phase-plane graphs refer arbitrarily and equally to either an upper or lower sideband component. The abbreviation "RF" is used to signify radio frequency signals, as well as signals in the microwave frequency range.

Figure 1A:
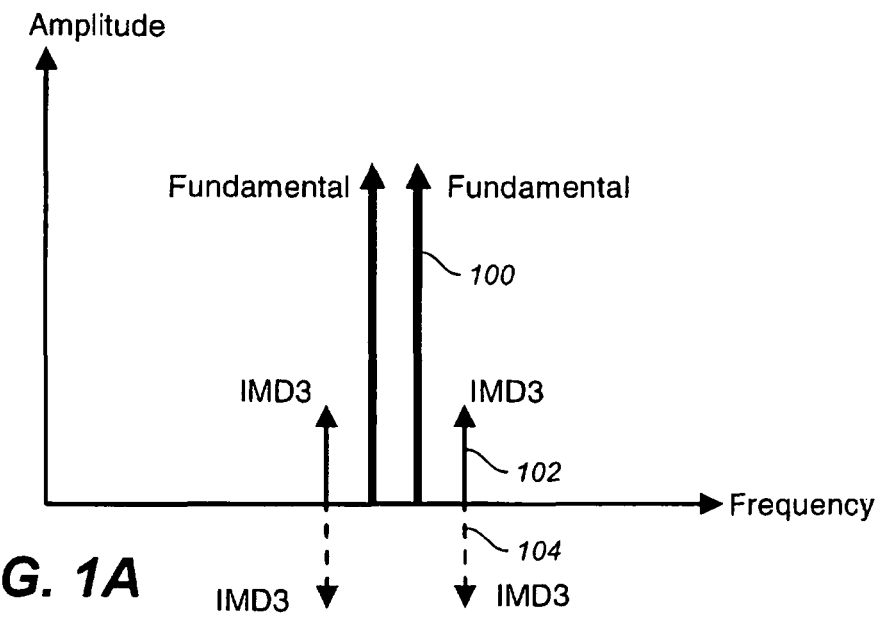
FIG. 1A is a graph showing in the frequency domain the fundamentals of a two-tone signal, undesired IMD3 distortion products of the fundamental signal, and canceling IMD3 distortion products.
Figure 1B:
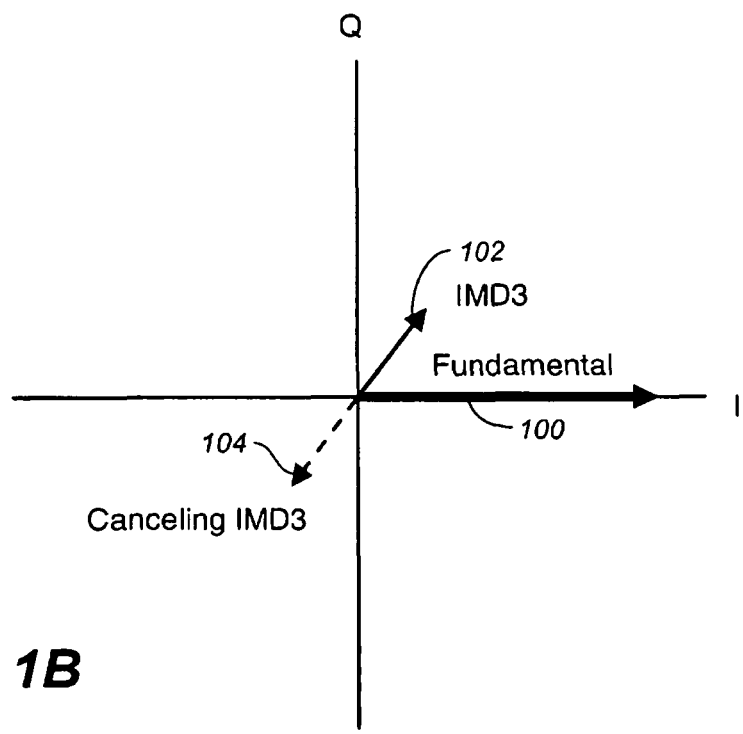
FIG. 1B is a phase-plane diagram for the data of FIG. 1A revealing vector relationships between the components.

Referring now to FIG. 1A-1B, there is shown a graph and a phase plane diagram of a distorted two-tone signal, emphasizing the upper fundamental 100 and the undesired upper IMD3 distortion product 102. The goal of the present invention is to generate and add to the system output canceling IMD3 104 such that overall IMD3 is canceled at the output without substantial interference to the fundamentals. The phase-plane diagram of FIG. 1B provides phase information unavailable in the spectrum diagram of FIG. 1A and demonstrates that at high RF and microwave frequencies the fundamental 100 and IMD3 102 vectors are not necessarily in phase with each other, but rather can be at any arbitrary phase angle, depending on many factors. Therefore, both the magnitude and phase of the canceling IMD3 vector 104 must be controlled for effective cancellation.

Figure 2A:
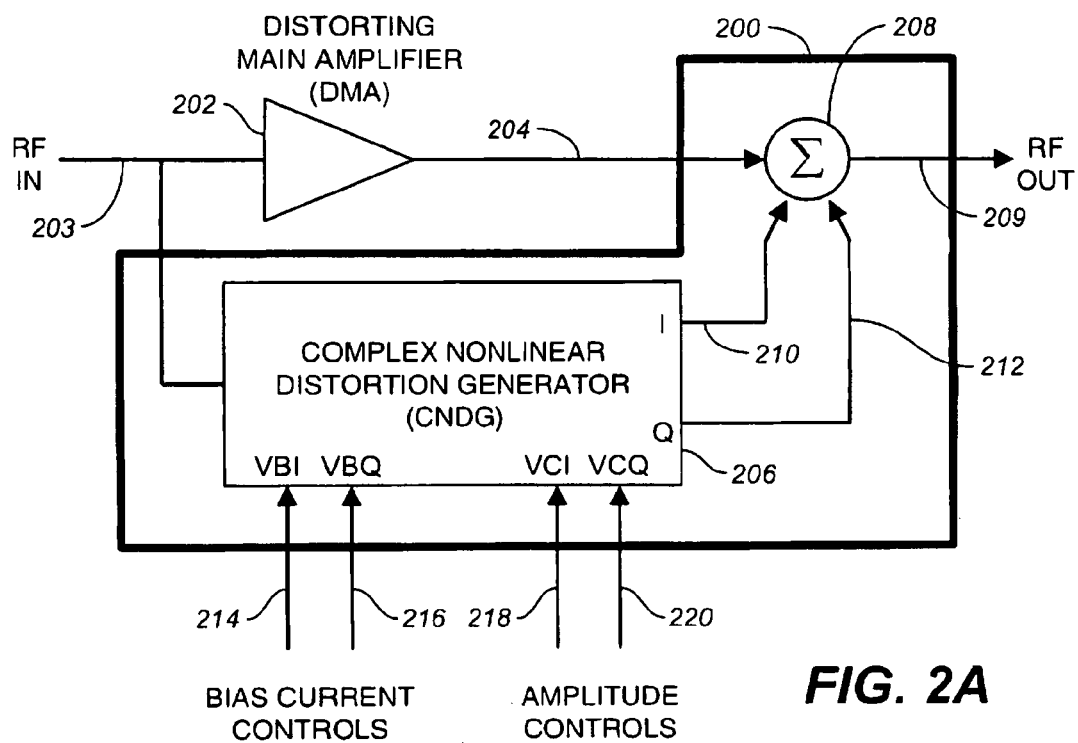
FIG. 2A is a block diagram showing a circuit including a Distorting Main Amplifier (DMA), a parallel Complex Nonlinear Distortion Generator (CNDG) sharing the DMA's input, and an output summation.
Figure 2B:
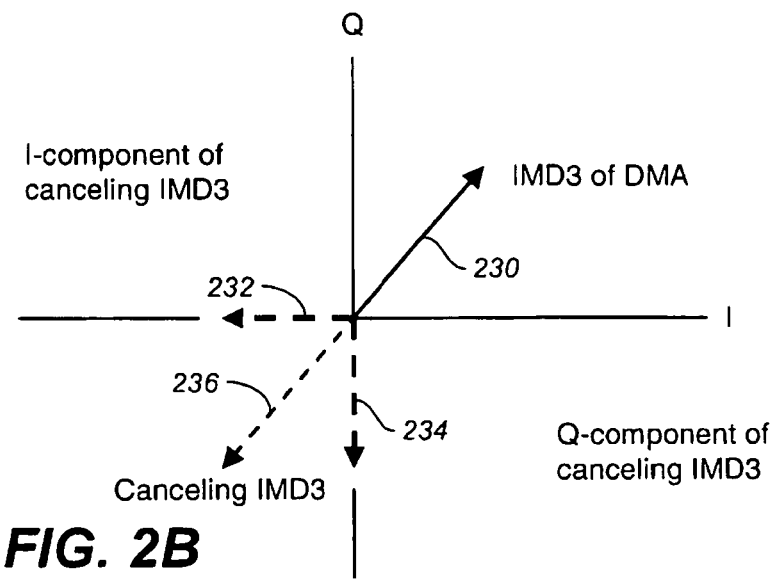
FIG. 2B is a phase plane diagram showing how the output of the CNDG of FIG. 2A has small amplitude in comparison to the DMA's fundamental output.
Figure 2C:
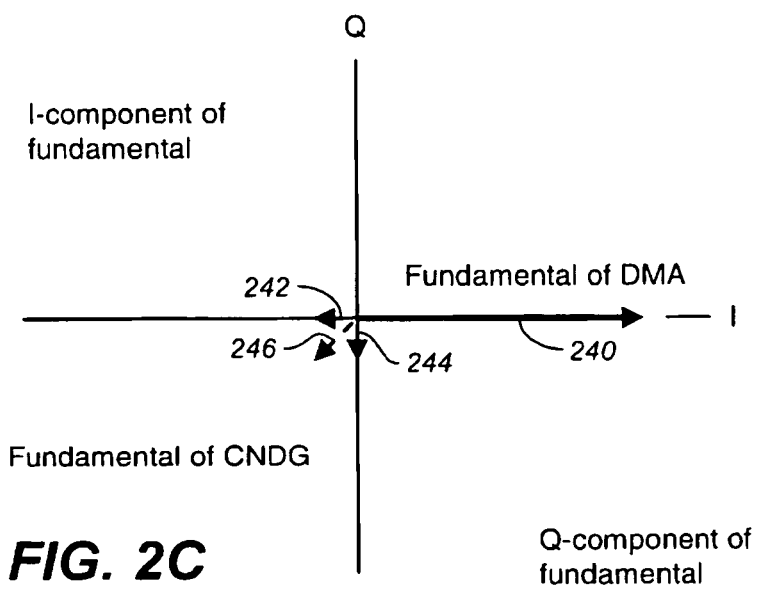
FIG. 2C is a phase plane diagram showing how the I and Q output IMD3 distortion components of the CNDG of FIG. 2A can vectorially sum to cancel the main amplifier's IMD3 distortion [note that the scale of FIG. 2C is not the same as that of FIG. 2B]

Referring now to FIGS. 2A-2C, a block diagram of linearizer 200 in parallel with a distorting main amplifier (DMA) 202 is illustrated according to the present invention. The objective is to sum DMA output current 204 with Complex Nonlinear Distortion Generator (CNDG) 206 output currents 210 and 212 using summation block 208 such that: (1) CNDG third-order intermodulation distortion (IMD3) output currents 232 and 234 vectorially sum to a IMD3 current 236 that is diametrically opposite to, and thus cancels, DMA IMD3 current 230; (2) CNDG fundamental output currents 242 and 244 vectorially sum to a fundamental current 246 that is small relative to the DMA fundamental output current 240. The net result is that total output IMD3 currents are cancelled while the fundamental output currents are substantially unaffected. Such a system constitutes a linearizer using rectangular vector coordinate system. The advantages of a rectangular coordinate system are significant, as will be described later.

Figure 3:
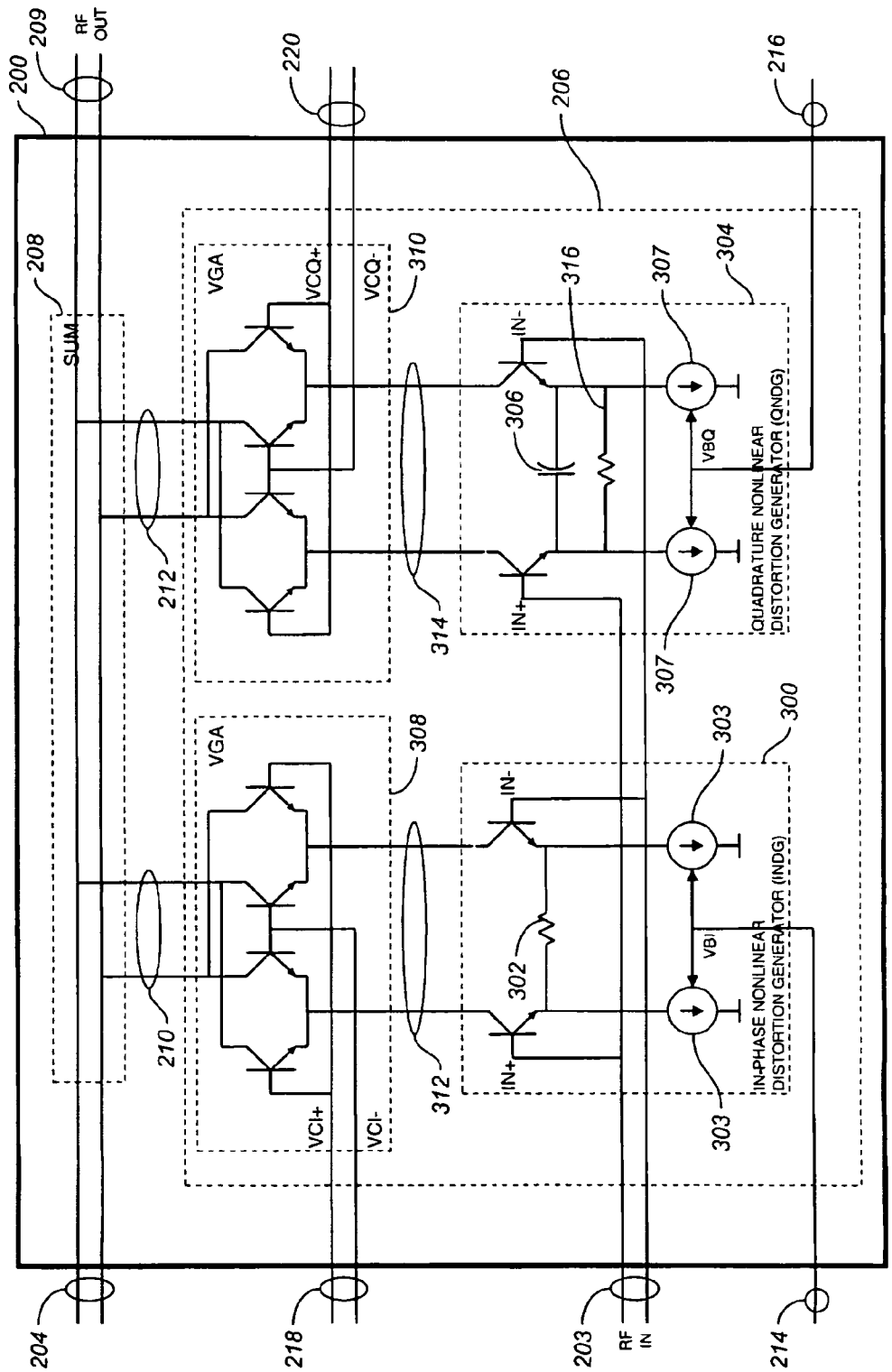
FIG. 3 is a schematic circuit diagram of a differential CNDG showing differential pairs with quadrature degeneration impedances, output variable gain attenuators, and summation.

Referring now to FIG. 3, a schematic diagram of an implementation of the CNDG 206 is illustrated according to the present invention. It is comprised of two nonlinear distortion generators (NDG). The first NDG is In-phase Nonlinear Distortion Generator (INDG) 300, and the second NDG is Quadrature Phase Nonlinear Distortion Generator (QNDG) 304. Variable gain amplifiers (VGA) 308 and 310 and summation 208 complete the linearizer.

Both INDG 300 and QNDG 304 are comprised of a differential pair of transistors and degeneration impedances. INDG 300 contains a resistive degeneration impedance 302 and QNDG 304 contains a capacitive degeneration impedance 306. The transistor biases and the degeneration impedance magnitudes are chosen such that the degeneration impedance dominates the transconductance gain of the NDGs. Since their inputs are identical and their degeneration impedances are in quadrature, INDG output currents 210 are in quadrature with QNDG output currents 212. It is in this way that quadrature components of distortion are directly generated, eliminating the need for an external phase shifter. The amount of INDG output current 312 passing to summation 208 is determined by variable gain amplifier (VGA) 308 as controlled by input 218. The amount of QNDG output current 314 passing to summation 208 by variable gain amplifier (VGA) 310 as controlled by input 220. Summer 208 consisting of hardwired connections. In contrast to many other linearizers, such simple summation is possible in the high-impedance lumped-element environment of a tightly integrated circuit.

In more detail, the term "strongly-driven" means RF signal swings are a large fraction of the standing current bias of the transistors such that device nonlinearities are sufficiently exercised to add appreciable nonlinear distortion to the signal as a fraction of the fundamental. A high fractional distortion content is desired such that when CNDG output distortion product amplitude matches that of the DMA, the CNDG output fundamental is small compared to that of the DMA.

The fractional distortion content is governed by the ratio of the NDG transistor's nonlinear base-emitter junction dynamic impedance to degeneration impedance. Since junction dynamic impedance varies with its bias current, but degeneration impedance does not, and adjustable bias current controls the fractional state of nonlinearity at a given RF input level. INDG control input 214 controls INDG DC bias current sources 303. QNDG control input 216 controls DC bias current sources 307. In typical use control inputs 214 and 216 are ganged together.

Other circuit parameters such as transistor size and degeneration impedance are chosen to create sufficient available distortion power to cancel a particular DMA's distortion power. Variable attenuators 308 and 310 are four-quadrant Gilbert VGAs [Gilbert, B., "A Precise Four-Quadrant Multiplier with Subnanosecond Response," IEEE Journal of Solid-State Circuits, VOL. SC-8, NO. 4, December 1968] and select how much of each phase is passed to summation 206, effectively performing vectorial tuning of the CNDG's distortion output for best linearization. Control input 218 controls the gain of VGA 308. Control input 220 controls the gain of VGA 310.

Note that strict orthogonality (right angles) between INDG and QNDG distortion components is not a requirement, as the combination of any two linearly-independent (not necessarily orthogonal) vectors span the entire phase plane. Orthogonality is desirable as it means one adjustment control does not influence the other, and the tuning convergence rate is enhanced. Fortunately the convergence rate is only a weak function of orthogonality for small deviations from orthogonality.

The strict resistive and reactive degeneration impedance combination presented so far indeed provides only a rough orthogonality because of numerous transistor parasitic influences that are significant at RF frequencies and also because the transistor junction dynamic impedances are identical while the degeneration impedances are in quadrature. It is the sum of dynamic junction impedance plus degeneration impedance that determines the transfer function, and the two sums are not in quadrature. Small alterations to the degeneration impedance, such as a small additional conductance 316 placed in parallel with the degeneration capacitance 306, fine tunes the orthogonality. Example component values for a typical CNDG might be 2 um×8 um emitter size bipolar transistors operating at 1 ma of bias current each, and degeneration impedances for operation at 900 $MH_Z$ being $R_{DEGEN}$ 302 of 1000 ohms, $C_{DEGEN}$ 306 equaling 0.5 pF, and a resistor in parallel with $C_{DEGEN}$ 316 of value 4000 ohms.

A single-ended variation of the CNDG is possible if the enhanced generation of even-order distortion could be tolerated, or possibly found to be of benefit. Although BJTs are shown in FIG. 3, FETs could be also substituted for the BJTs and retain the same functionality.

Figure 4:
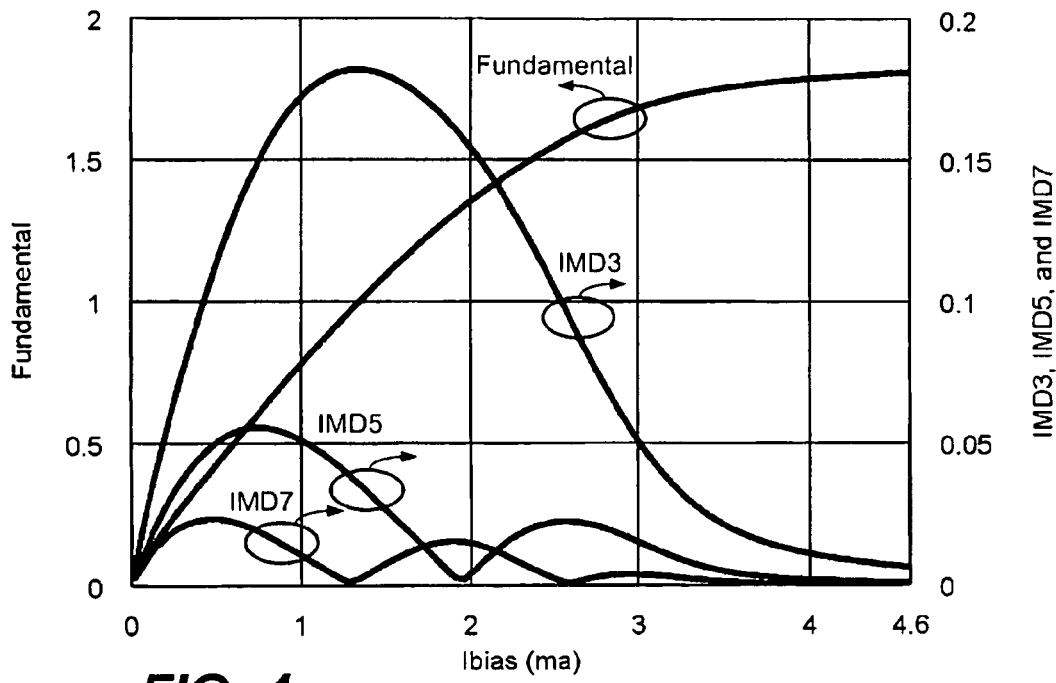
FIG. 4 is a graph showing the CNDG two-tone fundamental, IMD3, IMD5, and IMD7 output current magnitudes as CNDG bias currents are simultaneously swept.

FIG. 4 shows how the amplitudes of the various orders of BJT differential pair intermodulation spectral components change with bias current $I_{BIAS}$ when driven by a fixed two-tone RF input drive signal. Similar curves are generated by the INDG and QNDG. As expected all components are zero at zero $I_{BIAS}$. As $I_{BIAS}$ increases the fundamental amplitude increases monotonically and then levels out once $Z_{DEGEN}$ becomes dominate over the transistor's own $g_m$ in determining gain. In contrast however the nonlinear distortion components grow and diminish in the classic fashion of a conduction angle sweep [Steve C. Cripps, "RF Power Amplifiers for Wireless Communications," Section 3.2, $2^{nd}$ edition, Artech House, 2006]. A typical goal would be to adjust the $I_{BIAS}$ within each CNDG for peak IMD3 amplitude, and merely accept the smaller associated IMD5 and IMD7 components as is. Alternatively, $I_{BIAS}$ could be fine-tuned for a ratio of IMD3 to IMD5 that better addresses the ratios within the DMA for best overall reduction of all distortion products. This latter case is effective if multiple orders of DMA's IMD3 are roughly collinear in the phase plane.

The Tuning Process:

In actual operation, the CNDG is first set for minimum VGA attenuation and provided the highest anticipated RF input power level. Bias current controls VBI and VBQ are individually adjusted for a small rise (~5 dB) in total output distortion, ensuring sufficient distortion energy is available from each NDG to achieve cancellation. VCI and VCQ are then iteratively adjusted to steer the CNDG distortion vector to cancel the main amplifier's distortion. The quadrature nature of the distortion generators means an easily-tuned, rapidly-convergent solution is easily achieved using information from a conventional inexpensive scalar (i.e. amplitude-only) spectrum analyzer.

Figure 5:
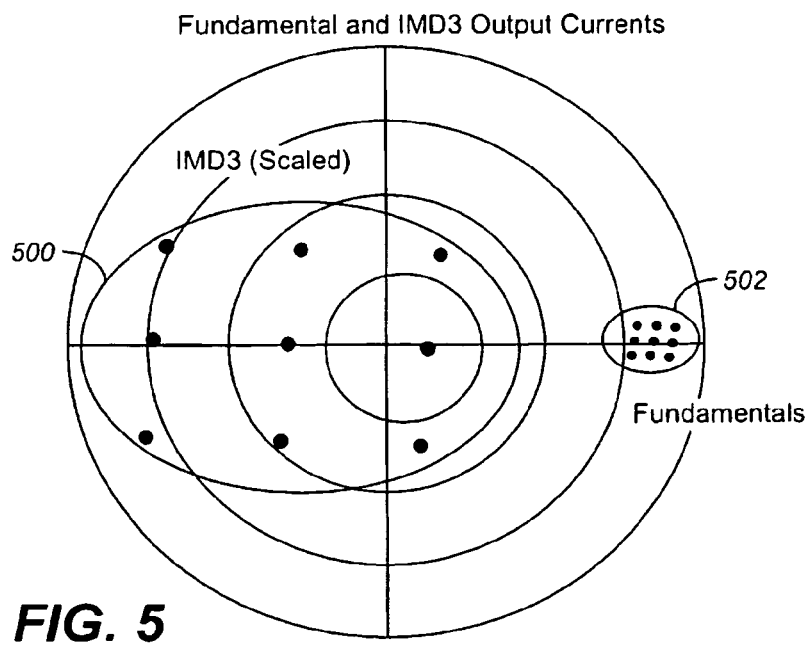
FIG. 5 is a polar phase-plane graph showing the summed DMA plus CNDG fundamental and IMD3 output currents as both VGAs are independently stepped their full range in three steps each.

FIG. 5 is a polar chart display of output 209 fundamental and (scaled-up) IMD3 currents as VCI 218 and VCQ 220 are each stepped over their full range in two steps centered on zero. The center dots correspond to zero output current (fundamental or distortion) from CNDG 206 outputs 210 or 212. The desirable attributes demonstrated in the dot patterns are 1) good orthogonality, 2) large fractional movement of IMD3 simultaneous with little corresponding fractional movement of fundamentals, and 3) IMD3 encompassing the origin, meaning total output 209 IMD3 distortion (DMA plus CNDG) can indeed nulled, all without significant alteration to fundamental output power.

Figure 6:
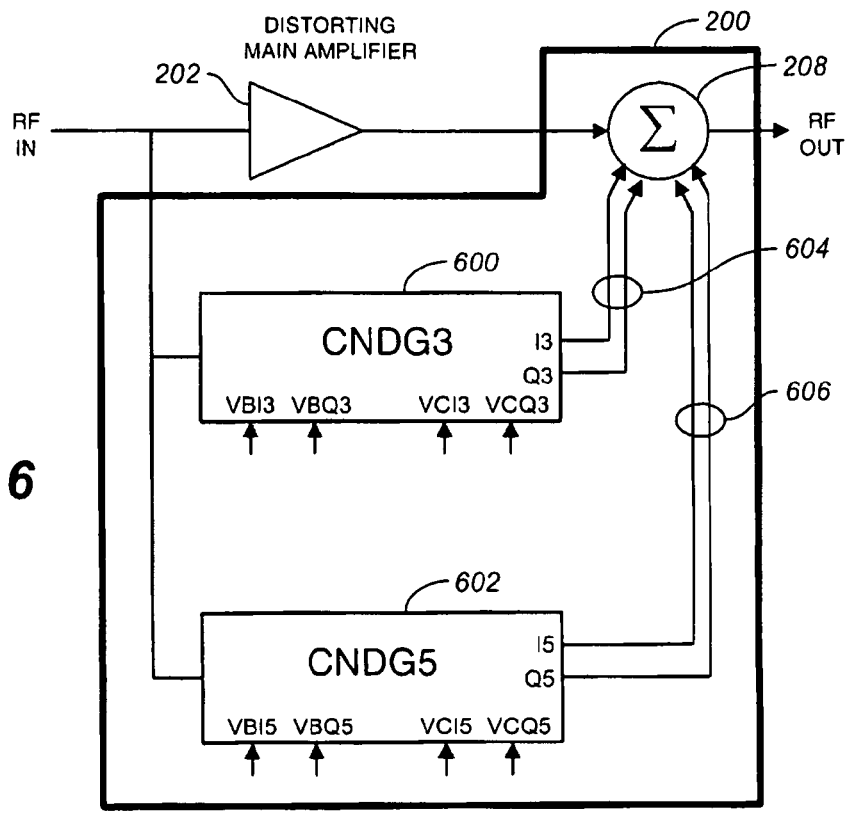
FIG. 6 is a block diagram showing a system with multiple CNDGs to independently address multiple orders of nonlinear distortion.

FIG. 6. While $3^{rd}$-order products dominate mildly distorting systems, as amplifiers are driven further into compression to improve power efficiency, higher order distortion products ($5^{th}$-order, $7^{th}$-order, etc.) become appreciable because of their higher growth rates. Similar to IMD3, these higher order products also manifest within and close in frequency to the fundamentals and can have arbitrary phase relationship the fundamentals or lower-order distortion products. To address such a DMA's higher-order distortion "signature", independent vectorial control of individual orders of distortion is desirable. Multiple CNDG's in parallel as shown in FIG. 6 could be invoked. An example of operation for independent linearization of different orders would be for the first CNDG 600 (labeled CNDG3 to emphasize its focus on third-order distortion products) to be biased for nulled IMD5 (1.9 ma in FIG. 4), while leaving appreciable IMD3 content at its output. The second CNDG 602 (labeled CNDG5 to emphasize its focus on fifth-order distortion products) could be biased for maximum IMD5 (0.75 ma in FIG. 4), albeit with some remaining IMD3 content. The output of CNDG5 602 is then vectorially tuned with VCI5 and VCQ5 controls to null DMA IMD5s. Then the output of CNDG3 (with nulled IMD5) is vectorially tuned with VCI3 and VCQ3 to null the sum of DMA+CNDG5's total IMD3 distortion. Yet additional CNDGs can be added and tuned in an analogous fashion to address yet higher orders of distortion.

The present invention linearizes over a moderate instantaneous bandwidth about a center frequency, typically 10% instantaneous bandwidth depending on linearization goals. The limitation on instantaneous linearization bandwidth is the change in magnitude of the reactive degeneration impedance 306 with frequency, altering both fractional and absolute levels of distortion currents 212. The fractional alteration is analogous to altering the conduction angle with $I_{BIAS}$ as in FIG. 4 and can be compensated with a re-adjustment of VBQ 216. A final adjustment of the VGA control 220 will recover the absolute level of distortion, and the linearizer is now compatible with multi-band systems.

Figure 7:
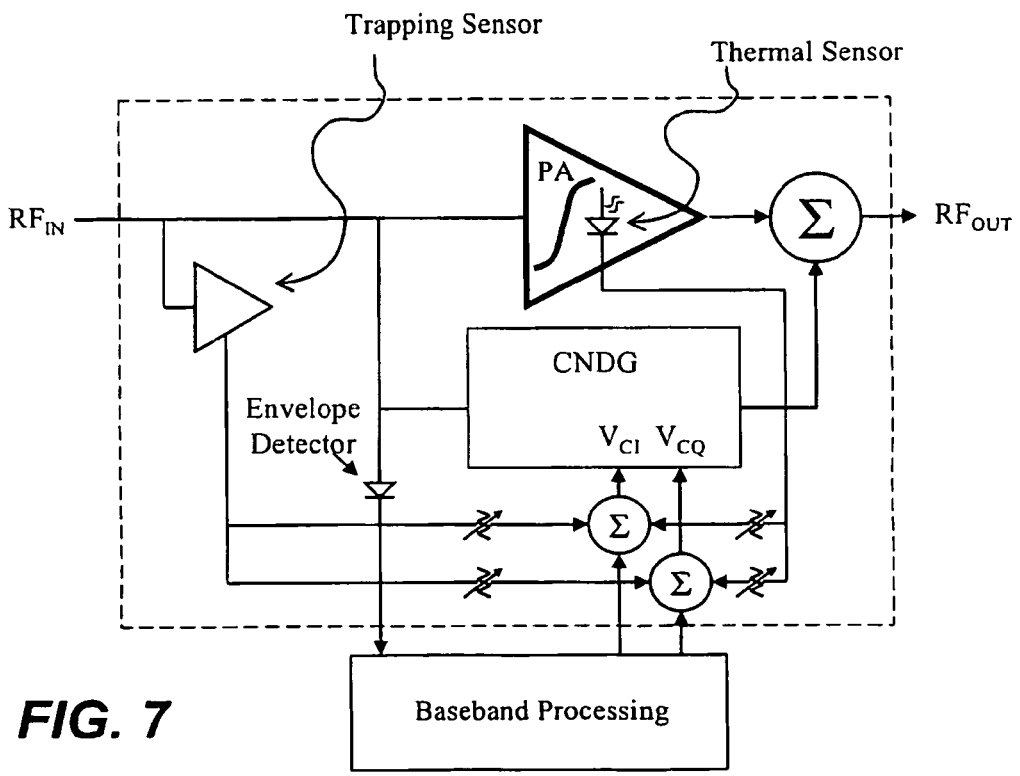
FIG. 7 is a block diagram showing conceptual means to incorporate baseband electrical, thermal, and trapping information into the CNDG controls.

Now referring to FIG. 7, it will be noted that some attributes of IMD3 are influenced by long-term memory effects caused by bias circuit reactances, dynamic thermal effects, and charge trapping within semi-insulating substrates [Aaen, Pla', Wood, *Modeling and Characterization of RF and Microwave Power FETs*, Cambridge University Press, 2007]. Because the present invention's transistors share the same substrate and electrical impedance environment as the DMA, their embodiment of the same long-term memory effects are available to compensate in some fashion for DMA long-term memory effects. Or discrete sensors of the above phenomenon might drive an on-chip CNDG comprising an integrated solution. FIG. 7 is a block diagram showing conceptual means to incorporate such baseband information into the CNDG controls.

Figure 8:
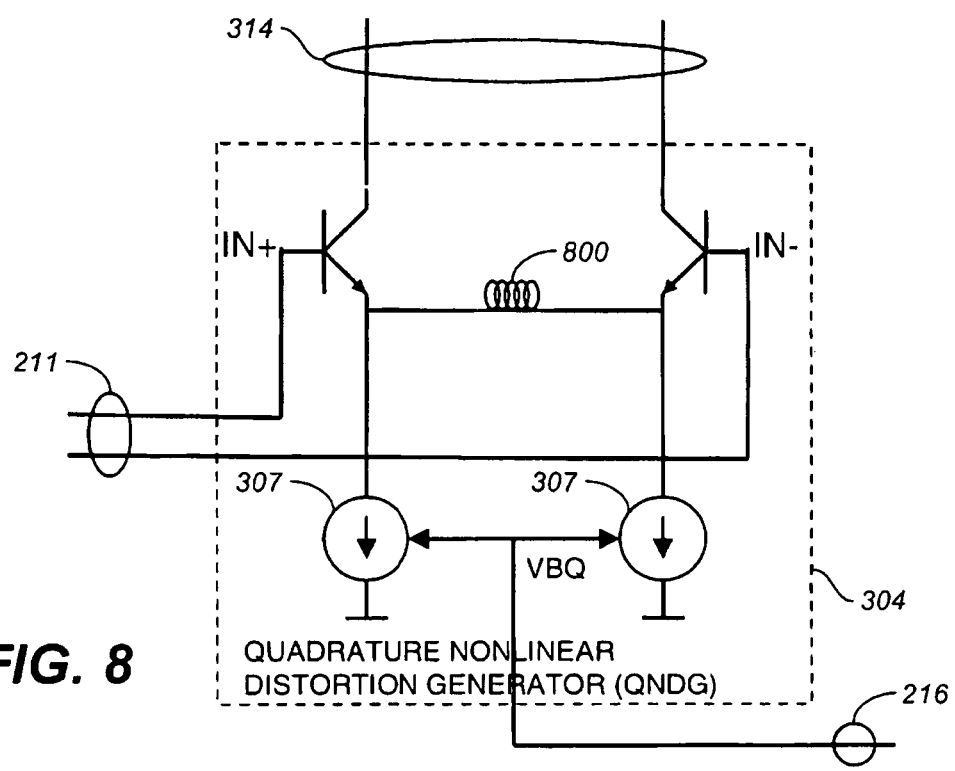
FIG. 8 is a QNDG schematic diagram showing the inventive circuit using an inductor rather than a capacitor.
Figure 9A:
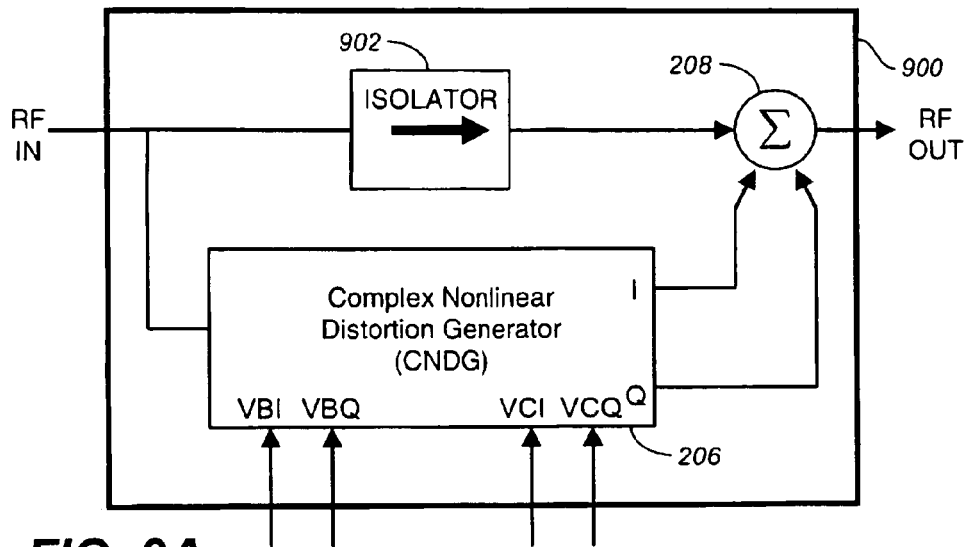
FIG. 9A is a block diagram of a predistortion linearizer circuit with reverse path isolation.
Figure 9B:
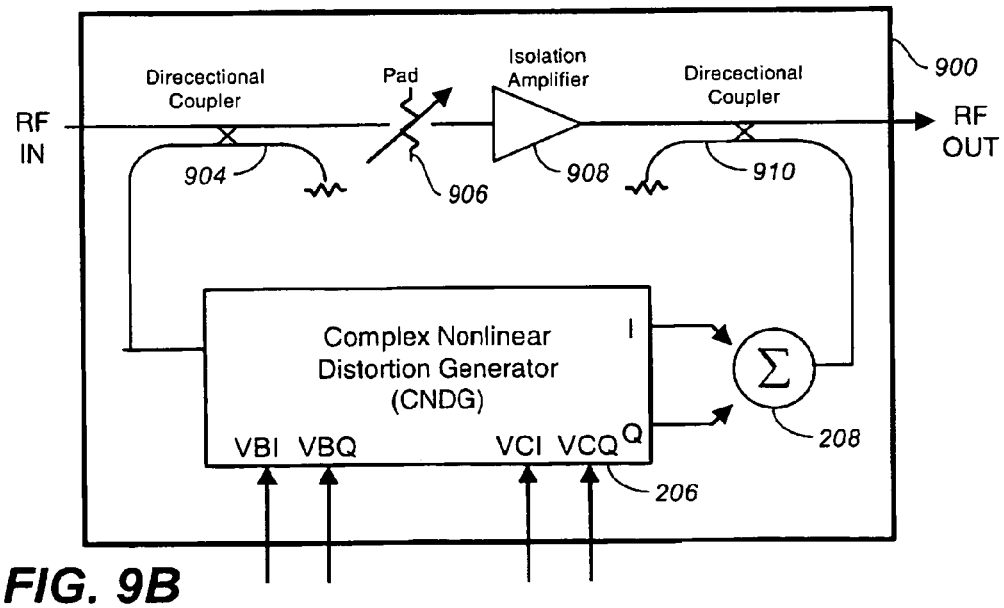
FIG. 9B shows various hardware means to incorporate reverse path isolation into the predistortion linearizer of FIG. 9A.
Figure 9C:
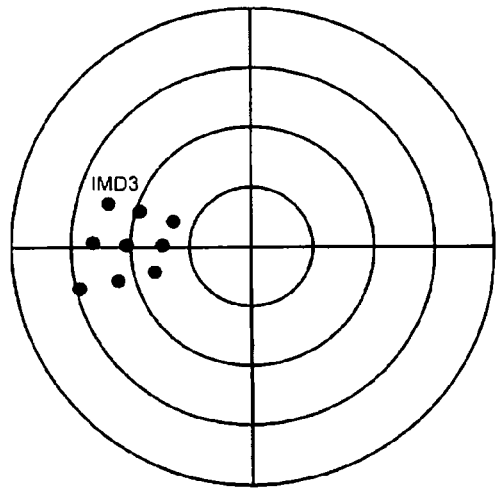
FIGS. 9C-9E are polar phase plane graphs showing IMD3 amplitude and orthogonality for various values of reverse path isolation.
Figure 9D:
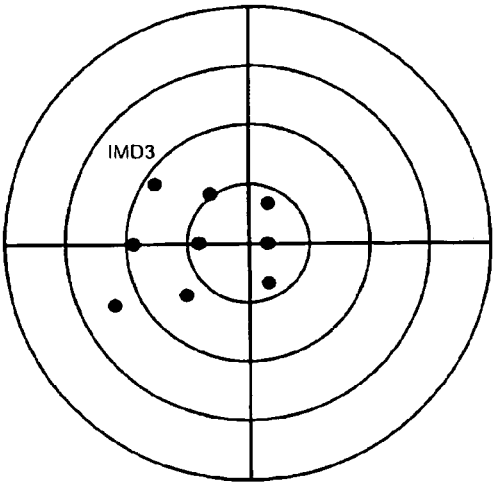
Figure 9E:
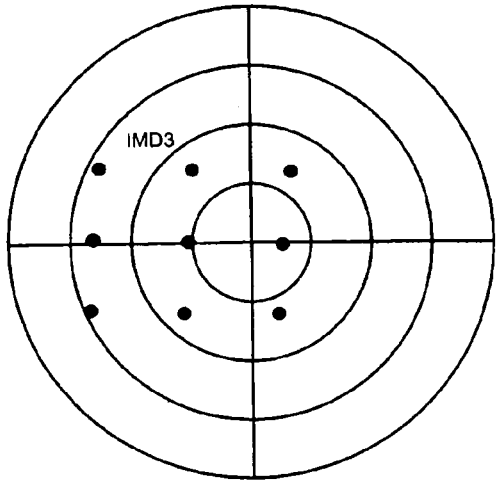

FIG. 8 shows an alternative embodiment of QNDG 304 utilizing inductor 800 rather than capacitor 306 as a degeneration impedance. Like capacitors, the impedance of inductors is reactive and thus in quadrature with the impedance of INDG 300 degeneration resistors. The ability of inductors to pass DC bias currents may be an advantage in some situations, for example in the cancellation of a single current source's common-mode noise at the output of a differential pair. Example component values for a typical CNDG might be 2 um×8 um emitter size bipolar transistors operating at 1 ma of bias current each, and degeneration impedances for operation at 5 GHz being $R_{DEGEN}$ 302 of 300 ohms and an $L_{DEGEN}$ 306 equaling 10 nH.

FIG. 9 shows an alternative embodiment of the present invention. In addition to linearizing a local DMA 202, system 200 also provides simultaneous predistortion linearization functionality by virtue of adding nonlinear distortion products to the signal path that can destructively interfere with those contributed by both upstream and downstream components. Such predistortion linearization functionality is also possible without the local DMA. Still referring to FIG. 9, a CNDG 206, summation 208, plus an isolator 902 creates a stand-alone predistortion linearizer 900. Isolator 902 passes the fundamental power from input to output (since the fundamentals cannot pass through CNDG 206) and attenuates feedback from CNDG 206 output back to its own input—functionalities previously provided DMA 202. The deleterious effect of feedback is illustrated in the simulation results of FIG. 9C-E, where VGA 308 and 310 gains are independently stepped over their full range in two steps each centered at zero. FIG. 9C (0 dB of reverse isolation) shows significant loss of CNDG IMD3 output amplitude and orthogonality. FIG. 9D reveals that a modest amount (6 dB) of feedback attenuation reconstitutes reasonable amplitude and orthogonality, sufficient for effective linearization. FIG. 9E is the case for infinite feedback attenuation (no feedback) for reference. FIG. 9B shows that the functionality of isolator 900 could be provided by an actual RF/microwave isolator (or its close variant, a circulator), or by other devices such as pad 906 (albeit at the expense of fundamental signal attenuation), input directional coupler 904, output directional coupler 910, and/or linear isolation amplifier 908, used singly or in combination.

Figure 10A:
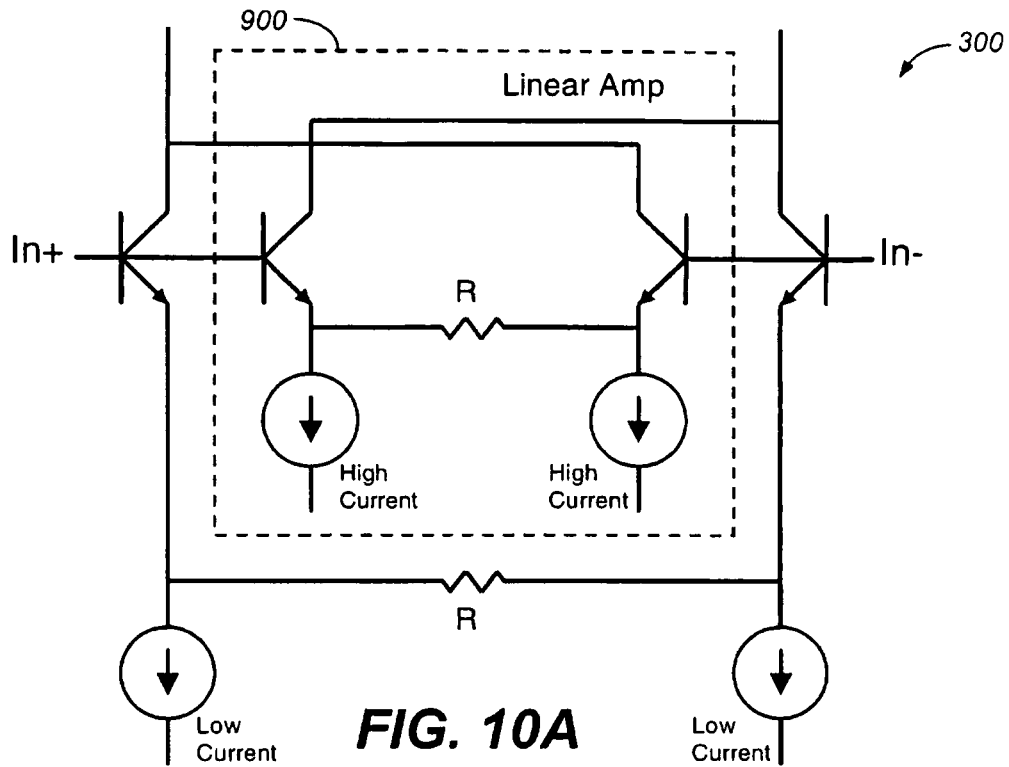
FIGS. 10A and 10B are schematic circuit diagrams showing means to reduce the CNDG's fundamental output current by including linear stages cross-coupled to the outputs and embodying gain-determining elements identical to those of the overdriven stages.
Figure 10B:
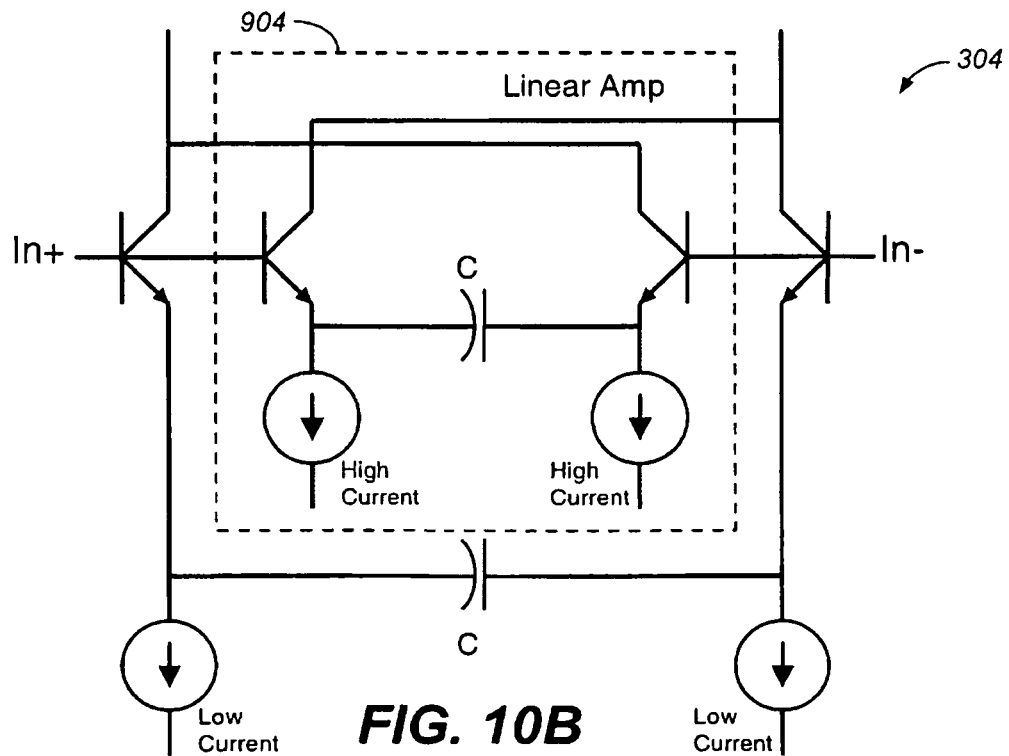

FIG. 10 shows yet another alternative embodiment of the present invention. The fact that the CNDG operates at a much higher state of fractional nonlinearity than the DMA and yet with distortion products commensurate with those of the DMA means the CNDG fundamental output is small compared to that of the DMA. For example, if DMA distortion products are −30 dBc (0.1% of fundamental power), and the CNDG distortion products are −20 dBc (1% of fundamental power), then the CNDG fundamental is 10% (−10 dBc) of the DMA fundamental. While small, the CNDG's fundamental output is nonetheless appreciable as it interferes (perhaps constructively, perhaps destructively, perhaps somewhere in between) with the DMA's fundamental, complicating CNDG tuning if best linearization at a specific output power is required. The CNDG fundamental can be eliminated as shown in FIGS. 10A and 10B with alternative embodiments of INDG 300 and QNDG 304 respectively, that include additional differential pairs 900 and 904. Differential pairs 900 and 904 are comprised of the same gain-determining degeneration impedances as the original differential pairs but, by virtue of higher bias currents, are far more linear. The additional differential pairs' fundamental output cancels those of the overdriven differential pair because of the cross-coupling at the output. As a result only nonlinear distortion products are present at the CNDG's output, and tuning for best linearity does not alter the fundamental output.

Figure 11:
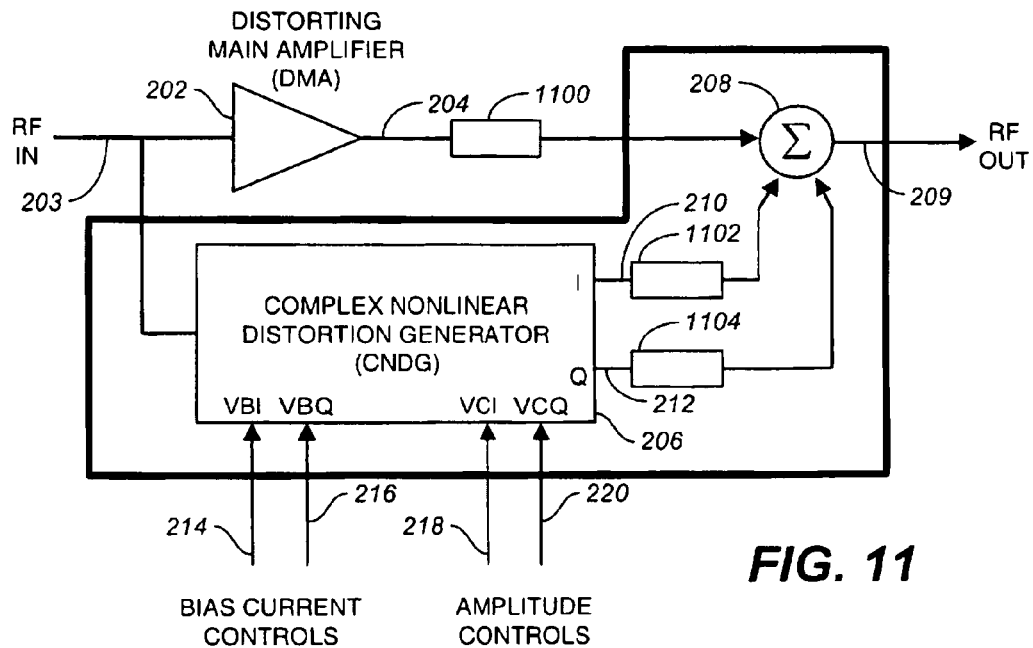
FIG. 11 is a block diagram showing the inventive circuit with additional elements for simultaneous enhancement of fundamentals and suppression of distortion.

FIG. 11 shows a still further alternative embodiment of the present invention, for tuning both linearity and power added efficiency. In many situations power added efficiency could be compromised if fundamental output is diminished when linearity is improved. Both linearity and power added efficiency may both be simultaneously enhanced by arranging for simultaneous destructive interference of distortion components and constructive interference of fundamental components. The desired tuning of the appropriate vectors may be obtained by adding lumped and distributed elements to the DMA output (1100) and to the INDG output (1102) and to the QNDG output (1104) [Cho, K-J., "Linearity Optimization of a High Power Doherty Amplifier Based on Post-Distortion Compensation," IEEE Microwave and Wireless Components Letters, VOL. 15, NO. 11, November 2005] as shown in FIG. 11.

Figure 12A:
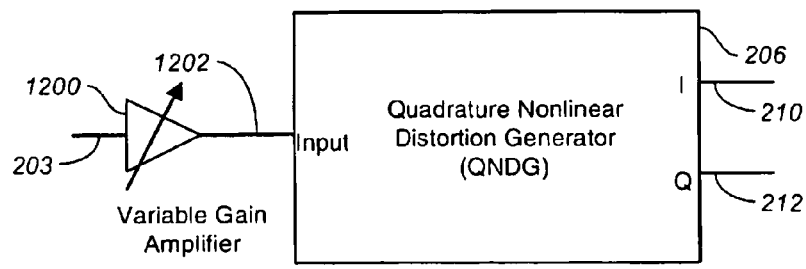
FIG. 12A is a block diagram showing a variable gain amplifier at the CNDG input.
Figure 12B:
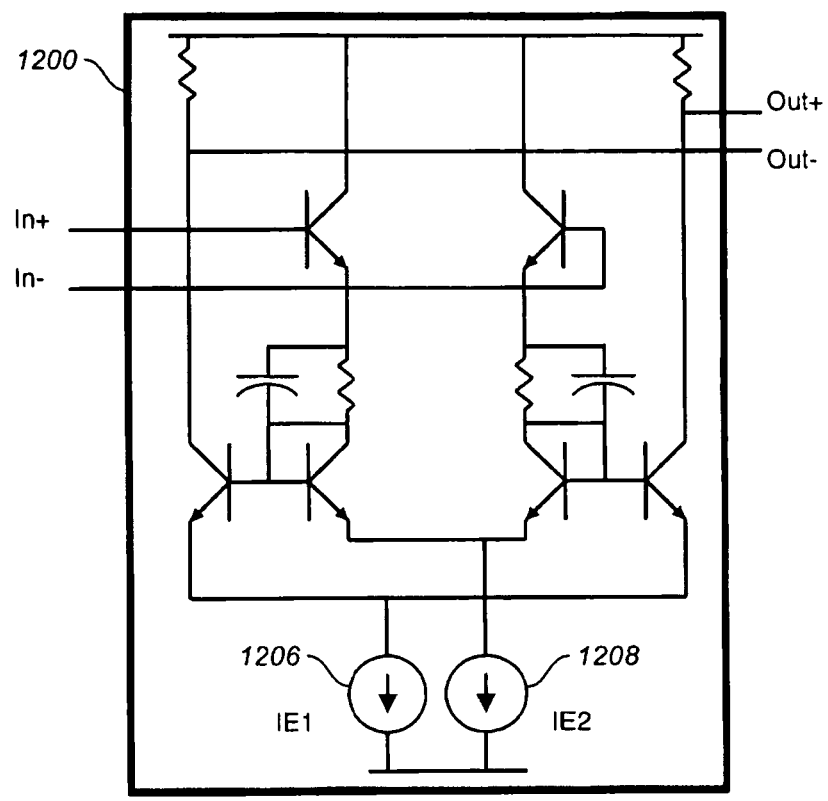
FIG. 12B is a schematic circuit diagram of a prior art variable gain amplifier.

FIG. 12 shows an embodiment with a single input attenuator. Referring now to FIG. 12, a variable gain amplifier 1200 placed at the input 203 enables CNDG 206 to be compatible with DMAs of differing gains. Variable RF input amplitude 1202 permits monotonic control over all distortion terms, rather than the very complicated patterns obtained while varying $I_{BIAS}$. An example of a prior art differential VGA is FIG. 11B, adapted from [Wyszynski, A., et al., Design of a 2.7-GHz Linear OTA and a 250-MH$_Z$ Elliptic Filter in Bipolar Transistor-array Technology, IEEE Trans. Circuits and Systems, Vol. 40, No. 4, April 1993, pp. 258-262]. Gain is adjustable by varying the IE1 1106 and IE2 1108 bias currents.

Figure 13:
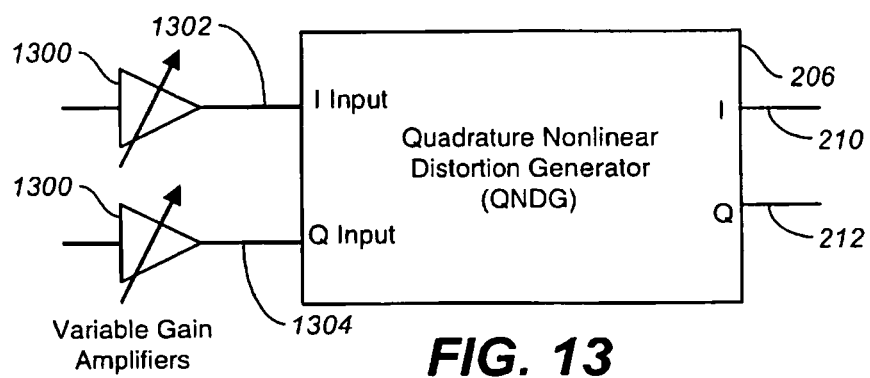
FIG. 13 is a schematic block diagram showing independently adjustable variable gain amplifiers at the separate inputs to the INDG and QNDG distortion generators inputs within a CNDG.

FIG. 13 shows an embodiment with two input attenuators. Modern high efficiency DMAs such as Doherty amplifiers often embody very complicated nonlinearities that do not follow traditional expectations. The additional flexibility of providing independent variable gain amplifiers 1100 at CNDG I input 1202 and Q input 1204 to address DMA in-phase distortion products differing from DMA quadrature distortion products may prove beneficial in some applications.

Figure 14:
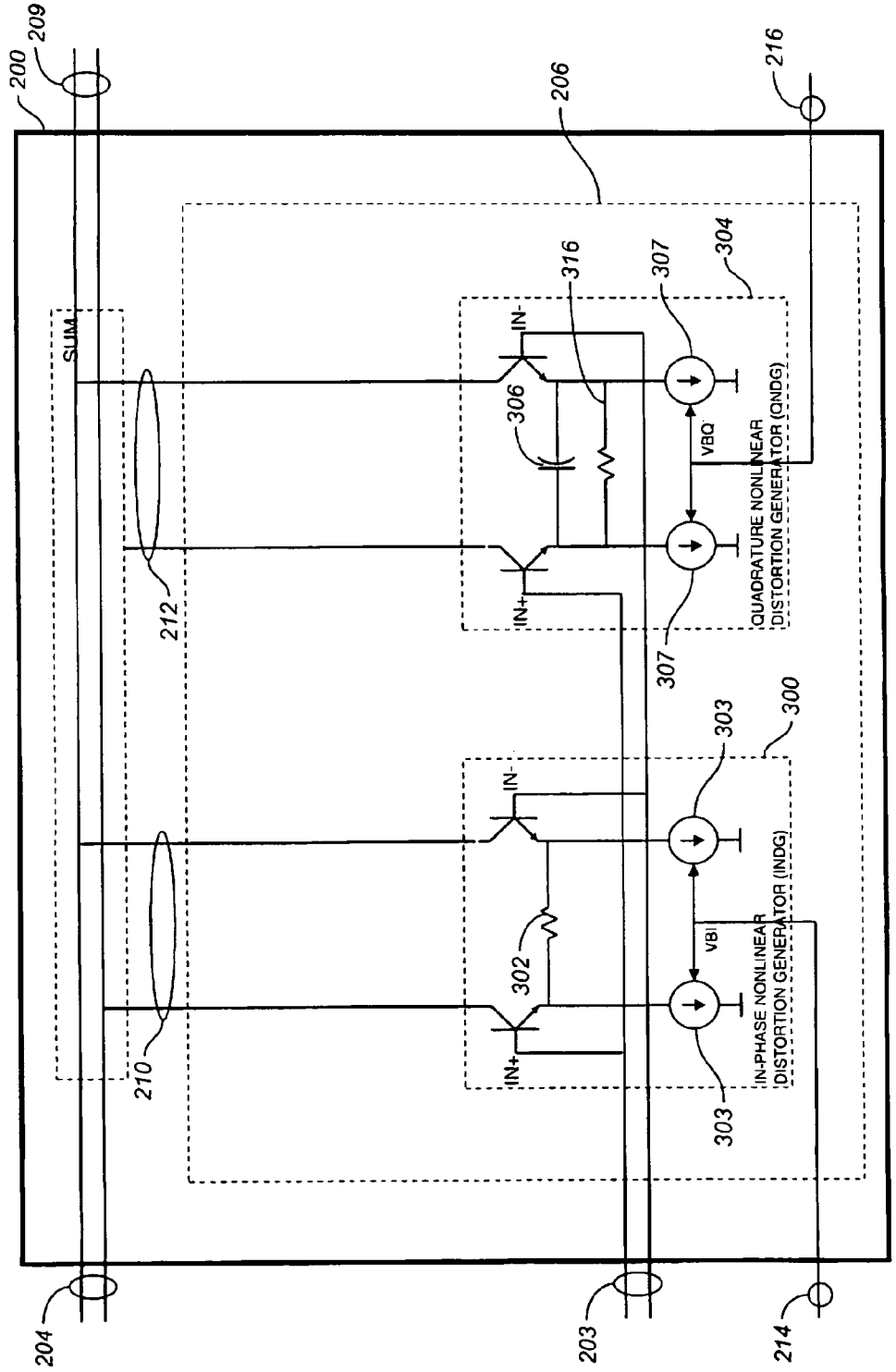
FIG. 14 is a circuit diagram of the CNDG of FIG. 3 with the VGAs removed.

FIG. 14 shows an embodiment that excludes VGAs. The four-quadrant Gilbert multiplier variable gain amplifiers (VGA) 308 and 310 may be deleted as shown in FIG. 14 if their adjustability is not needed or wanted (say in high volume manufacturing) or their voltage overhead cannot be afforded (say in handhelds or very low power applications). Successful linearization then depends on a stable manufacturing process and proper selection during design of INDG 300 and QNDG 304 parameters (device size, degeneration impedance, and bias current). Polarity changes can be effectuated by swapping differential input 203 or differential output 210 and/or 212 connections.

FIG. 15 shows an embodiment with a high efficiency amplifier with quadrature auxiliary amplifier. The benefits of an auxiliary amplifier embodying an electronically-tunable complex output current may be extended to high-efficiency Class AB and Class B amplifier configurations as shown in FIG. 15A. The configuration can be thought of as replacing the single scalar auxiliary peaking amplifier a conventional Doherty amplifier [Steve Cripps, *RF Power Amplifiers for Wireless Communications*, 2$^{nd}$ ed., Artech House, 2006] with a complex tunable auxiliary peaking amplifier, enabling easy exploration for an optimum of power, efficiency, linearity, or some combination.

Figure 15A:
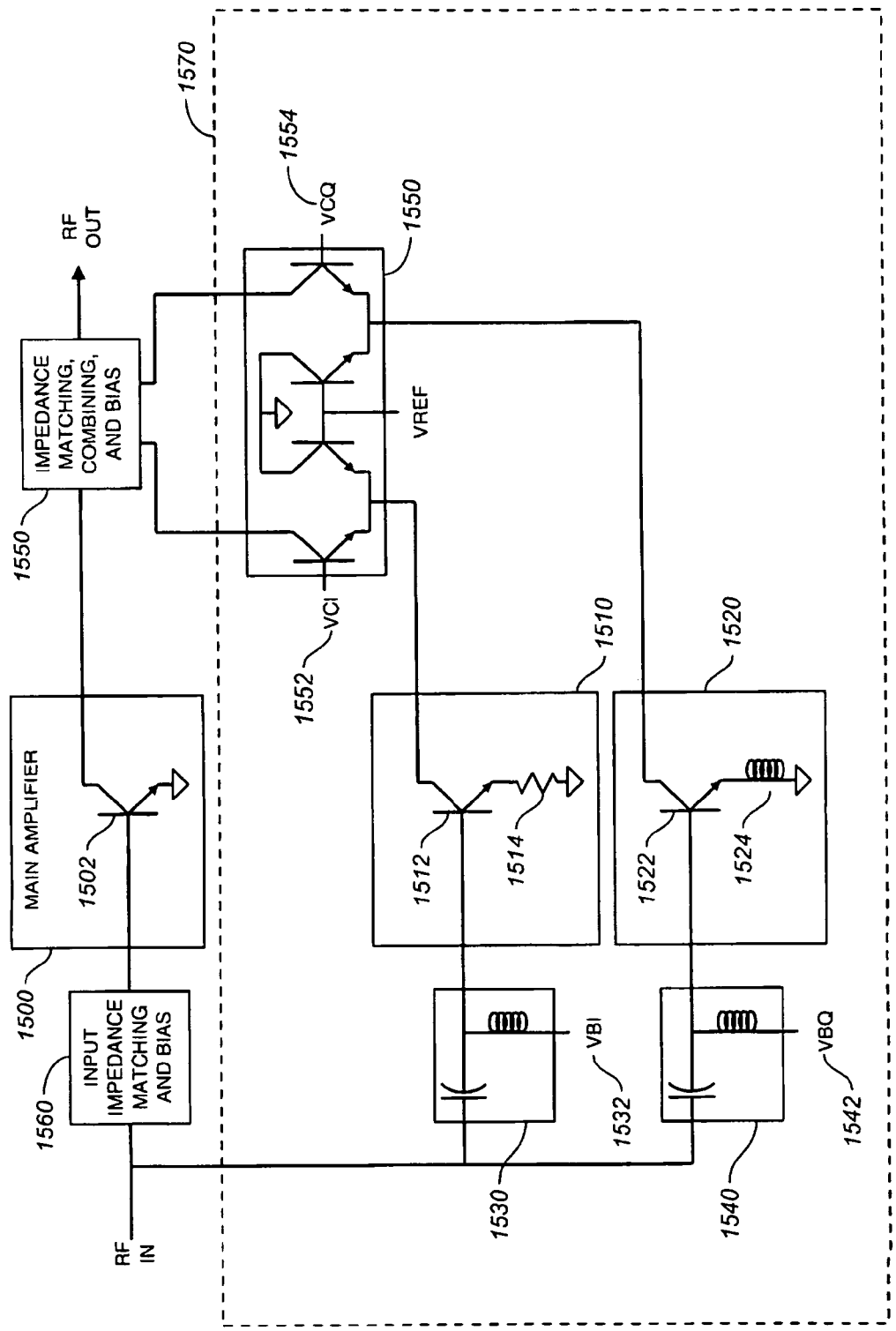
FIG. 15A is a schematic diagram of a main and a complex auxiliary amplifier operating in high efficiency modes for improved power, efficiency, and linearity.

Referring now to FIG. 15A, auxiliary peaking amplifier 1570 contains in-phase ("I") peaking amplifier 1510 and quadrature ("Q") peaking amplifier 1520 embodying transistors 1512 and 1522 respectively, and quadrature resistive and inductive degeneration impedances 1514 and 1524, also respectively. The transistors and are biased in a high efficiency mode as determined by their base (or gate, if in case of FETs) biases VBI 1532 and VBQ 1542 as applied through bias tees 1530 and 1540 respectively. Degeneration inductance 1524 may be replaced with a capacitor if operating frequency makes this convenient and if a biasing path can be secured. Single-quadrant VGA 1550 provides vector tuning via VCI 1552 and VCQ 1554 controls. Single-quadrant (as opposed to the prior four-quadrant) tunability is not necessarily a desirable aspect but rather a consequence of the single-ended nature of practical high efficiency amplifiers. A consequence is that the optimum tuning for the figure of merit(s) of interest (power, efficiency, linearity, or some combination) must be known at least to within a quadrant. Roughing in a design within this range should not be a problem given the present state of circuit analysis, simulation, and/or experience. The complex output of the auxiliary peaking amplifier is summed with the main amplifier output in combiner/impedance-matching-network 1550. As the main amplifier collector (or drain) voltage can approach zero (or even go negative), some impedance matching is required to lower the voltage swing at the auxiliary amplifier output such that its minimum voltage remains sufficiently high to maintain the auxiliary amplifier transistors in their forward-active region. A consequence of this impedance matching is increased current output requirements from the auxiliary amplifier.

The output currents of the main and auxiliary amplifiers will be now demonstrated under large-signal conditions as auxiliary amplifier tuning controls are varied. The available degrees of freedom are the base (or gate) biases of each auxiliary amplifier transistor (VBI and VBQ) and the VGA attenuation as controlled by VCI and VCQ. Their influences are somewhat different.

Figure 15B:
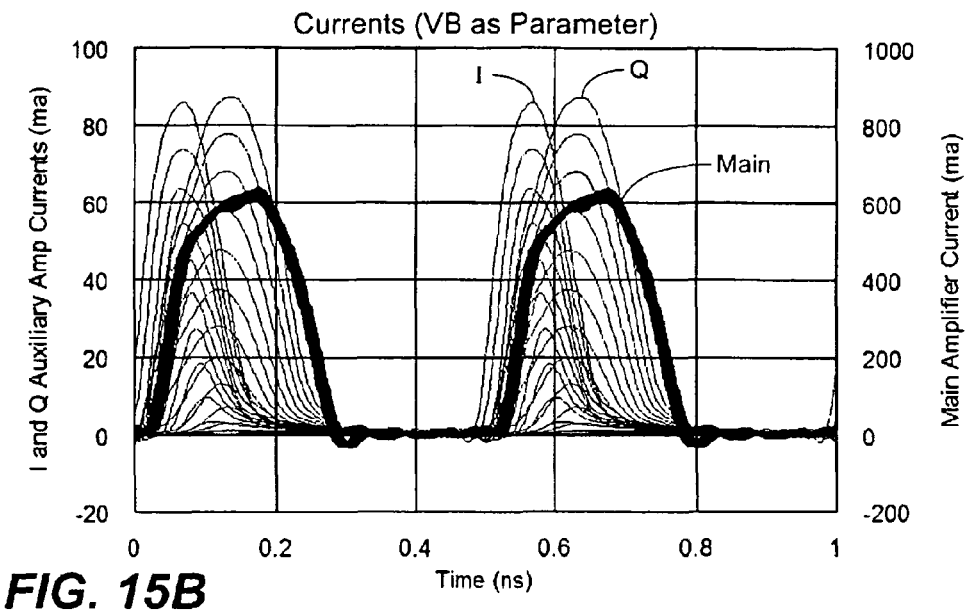
FIGS. 15B-E show high efficiency main and auxiliary amplifier output currents in the time-domain and spectral components in graphs and polar diagrams.
Figure 15C:
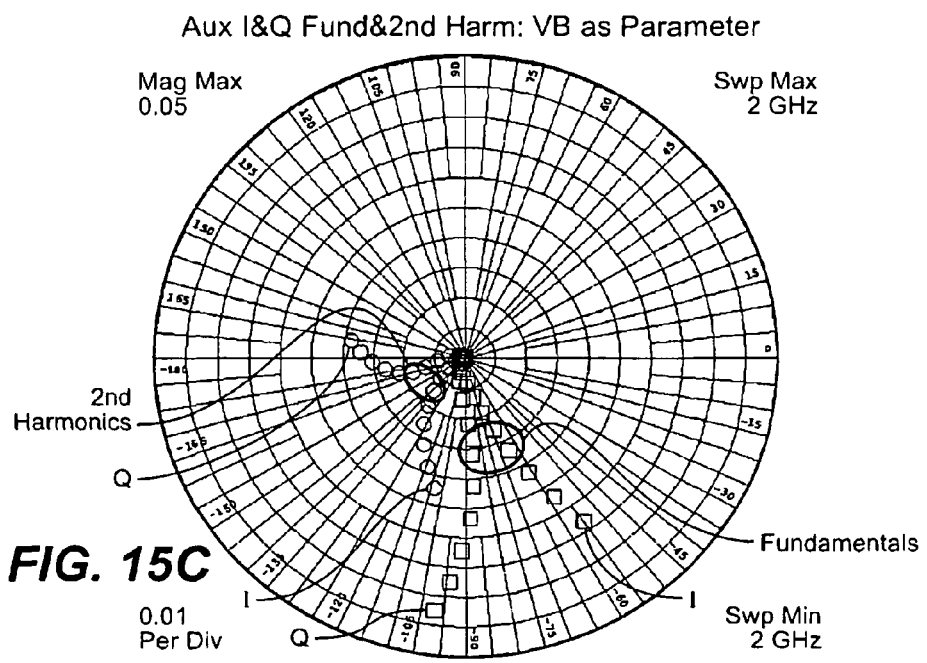

Firstly, VB (meaning VBI and VBQ ganged together) is varied while the VGA is fixed at minimum attenuation. FIG. 15B shows auxiliary amplifier output currents as VB is stepped positively from cutoff, demonstrating current pulses both growing and separating from each other in time from nearly in-phase towards quadrature. The increasing time separation occurs because, as VB is raised, time-average transistor $r_e$ (=$1/g_m$) is lowered such that the quadrature degeneration impedances increasingly dominate the transfer functions. It is noted that in this specific simulation the main amplifier current is slightly delayed by the main amplifier input impedance matching network 1560 (explaining its alignment with the quadrature auxiliary amplifier output), and the slight variation of main current is due to the changing auxiliary amplifier input impedance with VB, altering the input drive to the main amplifier transistor. FIG. 15C is a polar plot demonstrating that increasing phase separation occurs for both the fundamental and second harmonic components.

Figure 15D:
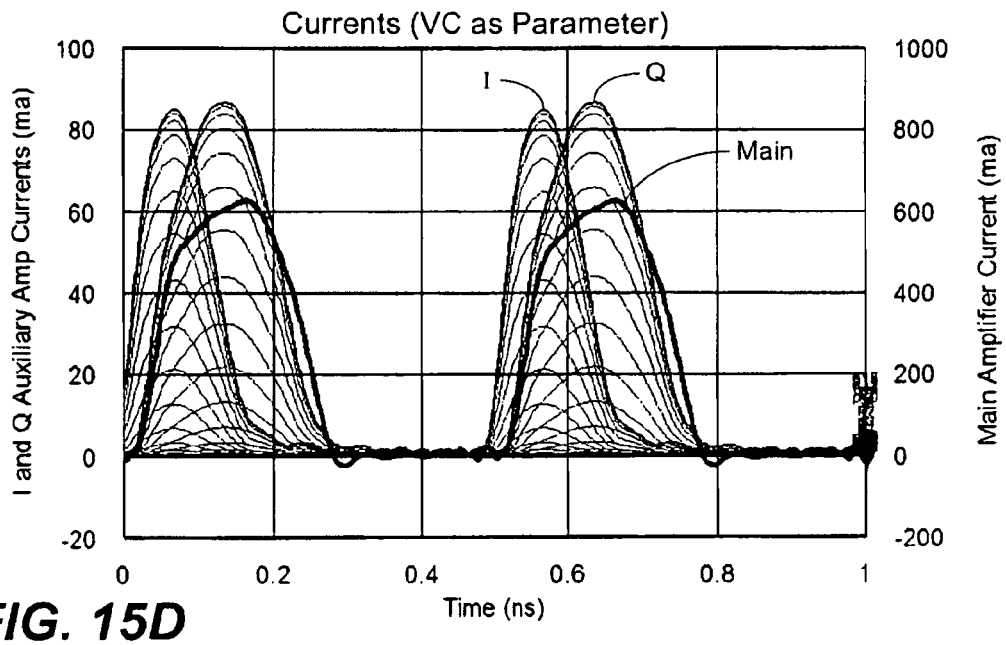
Figure 15E:
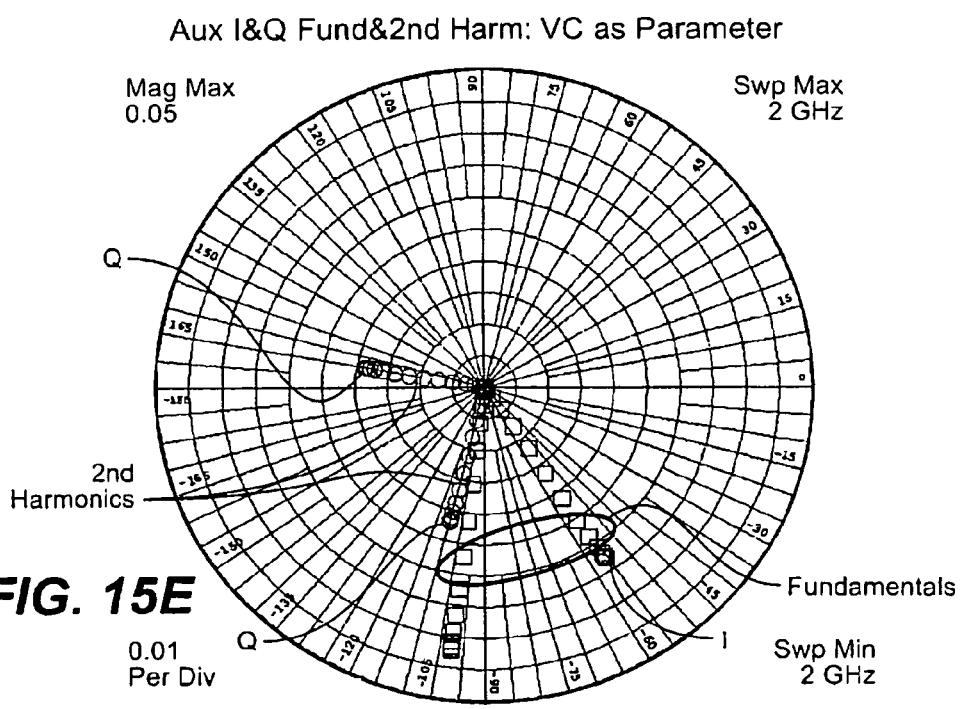

Secondly, VC (meaning VCI and VCQ ganged together) is varied with VB fixed at its most positive value from the previous simulation. FIG. 15D shows auxiliary output currents as VCI is stepped from maximum to minimum VGA attenuation, demonstrating auxiliary current pulses growing but maintaining constant time separation from each other. FIG. 15E is a polar plot demonstrating that phase separation remains constant for both the fundamental and second harmonic components as VB varies.

The complex auxiliary peaking amplifier just described brings myriad benefits to the overall amplifier by effectively performing fundamental and, to some degree, harmonic self-load-pull on the main amplifier. An analysis by which such improvements accrue is exceedingly complicated, or possibly intractable, as is clear in the literature [Cho, K-J., et. al., "Linearity Optimization of a High Power Doherty Amplifier Based on Post-Distortion Compensation," IEEE Microwave and Wireless Components Letters, VOL. 15, NO. 11, November 2005]. The present approach enables an empirical solution to be easily found for optimum overall amplifier performance and tradeoffs. It is possible for the optimum parameters to be ascertained during development and then fixed in the production environment, including the deletion of the VGA.

Figure 16:
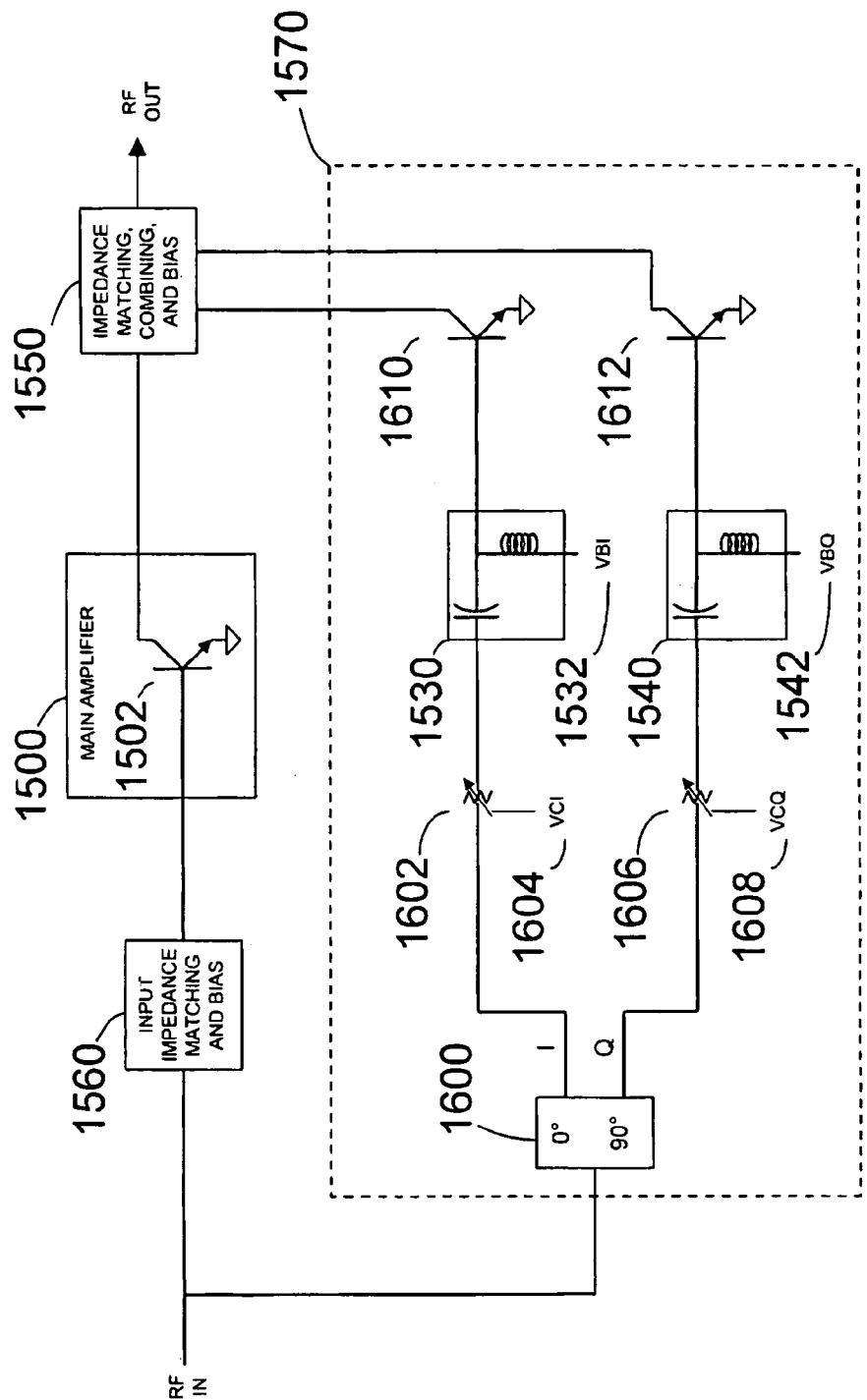
FIG. 16 is a schematic diagram of an alternative embodiment having a power saving and high efficiency circuit in which the quadrature phase splitting and variable gain operations precede the NDG stages.

In some applications best power efficiency is of utmost concern, and it is wasteful of power for the collector currents of NDG transistors 1512 and 1522 to flow through the voltage drop across variable attenuator 1550, and for their emitter currents to flow through the voltage drops across their quadrature degeneration elements 1514 and 1524. To save power and to help maintain NDG transistors 1512 and 1522 in the forward-active region, the quadrature phase splitting and variable gain operations may precede the NDG stages as shown in FIG. 16. Quadrature phase splitter 1600 and input variable gain elements 1602 and 1606 as controlled by inputs VCI 1604 and VCQ 1608 create quadrature I and Q input signals of independently controllable amplitudes to drive the NDG common-emitter transistor 1610 and 1612 inputs. The many ways to implement quadrature phase splitter 1600 include RC/CR polyphase networks and quadrature couplers such as Lange couplers. VBI and VBQ bias controls 1532 and 1542 will be typically set for high-efficiency Class-C operation of the NDG, providing a distortion-rich output content. The single-ended implementation of FIG. 16 provides in general all orders of distortion at the NDG output [Steve C. Cripps, "RF Power Amplifiers for Wireless Communications," Section 3.2, $2^{nd}$ edition, Artech House, 2006].

Figure 17:
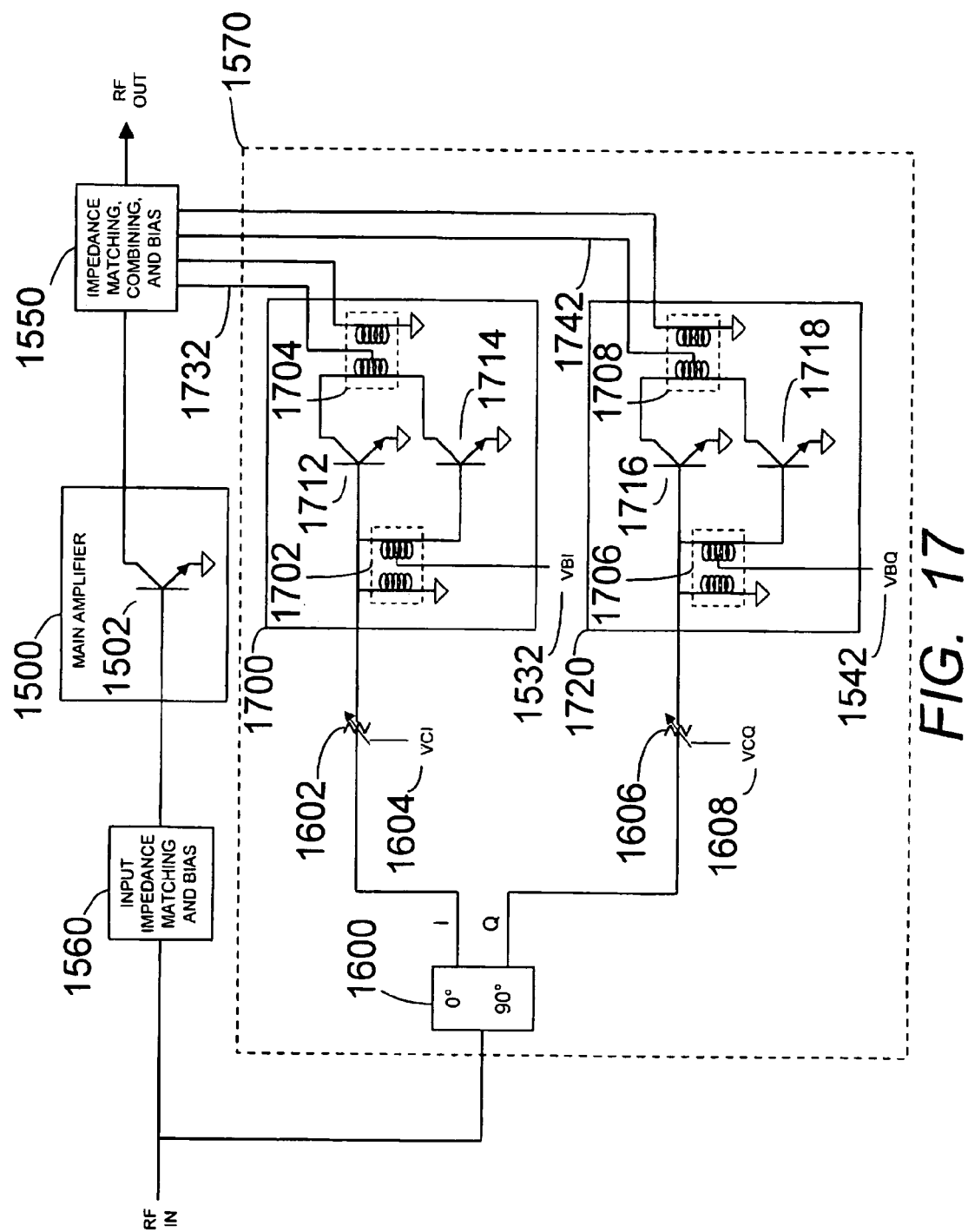
FIG. 17 is a schematic diagram showing yet another alternative embodiment of the inventive circuit in which even-order distortion products are eliminated using a pseudo-differential NDG implementation.

Often only odd-order distortion products are desired from the NDG. The even-order products can be eliminated using the pseudo-differential NDG implementations 1700 and 1720 as shown in FIG. 17. The pseudo-differential configurations using transformer hybrids 1702-1708 and transistors 1712-1718 eliminate even-order distortion products. The transformer hybrids further permit easy introduction of base biases 1532 and 1542 and collector biases 1732 and 1742 to the distortion-generating transistors.

The sequence of the nonlinear distortion generation, quadrature phase generation, and amplitude control may be varied or intertwined in different combinations and yet still achieve the desired result of controllable amounts of complex nonlinear distortion available for summation to an output for distortion cancellation purposes. For example, the output of a single nonlinear distortion generator may be split into quadrature phases, with either variable or fixed amounts of each quadrature phase summed with the system output for distortion cancellation.

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

Therefore, the above description and illustrations should not be construed as limiting the scope of the invention, which is defined by the appended claims.

What is claimed as invention is:

1. A linearizer for reducing nonlinear distortion in radio frequency and microwave systems having one or more fundamental frequencies, comprising:
   at least one complex nonlinear distortion generator (CNDG) directly generating odd-order in-phase and quadrature phases of RF and microwave nonlinear distortion products of the system input signal;

tunable control means to independently adjust the amplitude of each phase; and summation means to sum said in-phase and quadrature phases of nonlinear RF and microwave distortion products to the system output, whereby the sum of the nonlinear distortion products at the system output is reduced or eliminated by destructive interference while the fundamental frequencies are substantially unaffected;

wherein said CNDG comprises a plurality of odd-order nonlinear distortion generators ("NDG") generating the in-phase and quadrature phases of RF and microwave nonlinear distortion products of the system input signal;

wherein said odd-order nonlinear distortion generators comprise single-ended differential-pair or pseudo-differential-pair transistors driven appreciably into their nonlinear regions; and further including degeneration means, wherein said nonlinear distortion generators are degenerated with degeneration impedances in quadrature with one another.

2. The linearizer of claim 1, wherein each of said degeneration impedances is a circuit device selected from the group consisting of resistor, capacitor, and inductor.

3. The linearizer of claim 1, said tunable control means are Gilbert variable gain amplifiers.

4. The linearizer of claim 1, further including at least one additional CNDG in different states of fractional nonlinearity for independent control of distortion products of different order.

5. The linearizer of claim 1, further including a signal path isolator passing the fundamental power from input to output while attenuating feedback from CNDG output back to its own input.

6. A linearizer for reducing nonlinear distortion in radio frequency and microwave systems having one or more fundamental frequencies, comprising:

at least one complex nonlinear distortion generator (CNDG) directly generating odd-order in-phase and quadrature phases of RF and microwave nonlinear distortion products of the system input signal, said CNDG including a plurality of odd-order nonlinear distortion generators ("NDG"), wherein the amplitude of said in-phase and quadrature phases is independently controlled by the size, degeneration impedance, and bias current of said NDGs;

summation means to sum said in-phase and quadrature phases of nonlinear RF and microwave distortion products to the system output, whereby the sum of the nonlinear distortion products at the system output is reduced or eliminated by destructive interference while the fundamental frequencies are substantially unaffected;

wherein said odd-order nonlinear distortion generators comprise single-ended differential-pair or pseudo-differential-pair transistors driven appreciably into their nonlinear regions; and further including degeneration means, wherein said nonlinear distortion generators are degenerated with degeneration impedances in quadrature with one another.

7. The linearizer of claim 6, wherein each of said degeneration impedances is a circuit device selected from the group consisting of resistor, capacitor, and inductor.

8. The linearizer of claim 6, further including at least one additional CNDG in different states of fractional nonlinearity for independent control of distortion products of different order.

9. The linearizer of claim 6, further including a signal path isolator passing the fundamental power from input to output while attenuating feedback from CNDG output back to its own input.

* * * * *